(12) United States Patent
Ise et al.

(10) Patent No.: US 8,277,954 B2
(45) Date of Patent: Oct. 2, 2012

(54) ORGANIC ELECTROLUMINESCENT DEVICE

(75) Inventors: Toshihiro Ise, Ashigarakami-gun (JP); Seiji Ichijima, Machida (JP)

(73) Assignee: FUJIFILM Corporation, Tokyo (JP)

( * ) Notice: Subject to any disclaimer, the term of this patent is extended or adjusted under 35 U.S.C. 154(b) by 951 days.

(21) Appl. No.: 11/709,791

(22) Filed: Feb. 23, 2007

(65) Prior Publication Data

US 2007/0196692 A1 Aug. 23, 2007

(30) Foreign Application Priority Data

Feb. 23, 2006 (JP) ................................. 2006-047153

(51) Int. Cl.
*B32B 19/00* (2006.01)
*B32B 9/00* (2006.01)
*H01J 1/62* (2006.01)
*H01J 63/04* (2006.01)
*H01L 29/08* (2006.01)
*H01L 35/24* (2006.01)
*H01L 51/00* (2006.01)

(52) U.S. Cl. ........ 428/690; 428/917; 313/504; 313/506; 257/40; 257/E51.044

(58) Field of Classification Search .................. 428/690, 428/917; 313/504, 506; 257/40, E51.044
See application file for complete search history.

(56) References Cited

U.S. PATENT DOCUMENTS

| 6,303,238 B1 | 10/2001 | Thompson et al. | |
| 2005/0202276 A1* | 9/2005 | Mishima et al. | ............... 428/690 |

FOREIGN PATENT DOCUMENTS

| DE | 10343757 A | 4/2005 |
| JP | 2002-356449 A | 12/2002 |
| WO | WO 0057676 A1 | 9/2000 |
| WO | WO2004/108857 A1 * | 12/2004 |

OTHER PUBLICATIONS

Japanese Office Action dated Jul. 12, 2011, in counterpart Japanese application No. 2006-047153.

\* cited by examiner

*Primary Examiner* — Bijan Ahvazi
(74) *Attorney, Agent, or Firm* — Sughrue Mion, PLLC

(57) ABSTRACT

An organic electroluminescent device comprises: a pair of electrodes; and at least one organic compound layer therebetween, the at least one organic compound layer comprises at least a light-emitting layer, wherein at least one of the at least one organic compound layer comprises at least one compound represented by formula (1):

Formula (1):

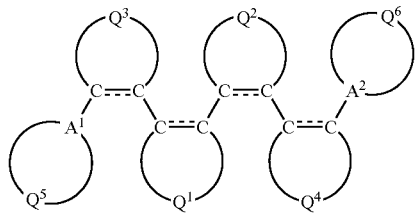

wherein $Q^1$ to $Q^4$ each independently represents an atomic group for forming an aromatic hydrocarbon ring or an aromatic heterocyclic ring in combination with two carbon atoms in formula (1); $A^1$ and $A^2$ each independently represents a carbon atom or a nitrogen atom; and $Q^5$ and $Q^6$ each independently represents an atomic group for forming an aromatic hydrocarbon ring or an aromatic heterocyclic ring in combination with $A^1$ and $A^2$ respectively, provided that $Q^5$ and $Q^6$ are not combined through a single bond, a divalent aromatic hydrocarbon ring group or a divalent aromatic heterocyclic ring group.

8 Claims, No Drawings

ORGANIC ELECTROLUMINESCENT DEVICE

BACKGROUND OF THE INVENTION

1. Field of the Invention

The present invention relates to an organic electro-luminescent device of emitting light by converting electric energy into light.

2. Description of the Related Art

An organic electroluminescent device is being aggressively studied and developed because light emission of high brightness can be obtained by low-voltage driving. The organic electroluminescent device has an organic layer between a pair of electrodes, and this is a device where an electron injected from a cathode and a hole injected from an anode are recombined in the organic layer and the energy of an exciton produced is utilized for light emission.

In recent years, the devices are becoming highly efficient by the use of a phosphorescent material. There have been disclosed inventions related to a phosphorescent device using an iridium complex, a platinum complex (see, U.S. Pat. No. 6,303,238 and International Publication 00/57676, pamphlet) or the like as the phosphorescent material, but a device satisfying both high efficiency and high durability has not yet been developed.

Also, inventions related to an organic EL device using a polyarylene material as a high-durability material have been disclosed (see, for example, JP-A-2002-356449 (the term "JP-A" as used herein means an "unexamined published Japanese patent application")). However, the materials used therein have a condensed ring or a long conjugate system and all are low in the lowest excited triplet level ($T_1$ level) of molecule and when used for a phosphorescent device, such a material quenches the light emitted from the phosphorescent material to decrease the light emission efficiency. This is prominent in the emission of light at a short wavelength, and serious quenching of light emission occurs particularly on use for a blue phosphorescent device.

SUMMARY OF THE INVENTION

An object of the present invention is to provide an organic electroluminescent device assured of high light emission efficiency and high durability.

The present inventors have made studies so as to attain the above-described object, as a result, it has been found that those problems can be solved by an organic electroluminescent device where an aromatic compound having a specific structure is contained in the organic compound layer. That is, the present invention has been achieved by the following means.

[1] An organic electroluminescent device, which comprises:

a pair of electrodes; and at least one organic compound layer between the pair of electrodes, the at least one organic compound layer comprises at least a light-emitting layer, wherein at least one of the at least one organic compound layer comprises at least one compound represented by formula (1):

Formula (1):

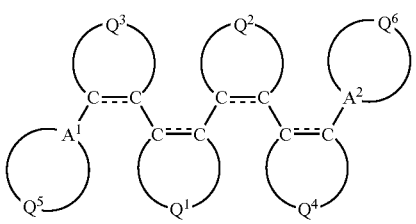

wherein $Q^1$ to $Q^4$ each independently represents an atomic group for forming an aromatic hydrocarbon ring or an aromatic heterocyclic ring in combination with two carbon atoms in formula (1);

$A^1$ and $A^2$ each independently represents a carbon atom or a nitrogen atom; and $Q^5$ and $Q^6$ each independently represents an atomic group for forming an aromatic hydrocarbon ring or an aromatic heterocyclic ring in combination with $A^1$ and $A^2$ respectively, provided that $Q^5$ and $Q^6$ are not combined through a single bond, a divalent aromatic hydrocarbon ring group or a divalent aromatic heterocyclic ring group.

[2] The organic electroluminescent device as described in [1] above, wherein the at least one compound represented by formula (1) has a glass transition temperature of from 130 to 450° C.

[3] The organic electroluminescent device as described in [1] or [2] above, wherein the at least one compound represented by formula (1) has the lowest excited triplet energy level of from 63 kcal/mol (263.97 kJ/mol) to 95 kcal/mol (398.05 kJ/mol).

[4] The organic electroluminescent device as described in any of [1] to [3] above, wherein the light-emitting layer comprises a light-emitting material, and wherein the light-emitting material comprises at least a phosphorescent material.

[5] The organic electroluminescent device as described in [4] above, wherein the phosphorescent material is an iridium complex or a platinum complex.

[6] The organic electroluminescent device as described in any of [1] to [5] above, wherein the light-emitting layer comprises the at least one compound represented by formula (1).

[7] The organic electroluminescent device as described in any of [1] to [6] above, wherein the at least one compound represented by formula (1) is represented by formula (2):

Formula (2):

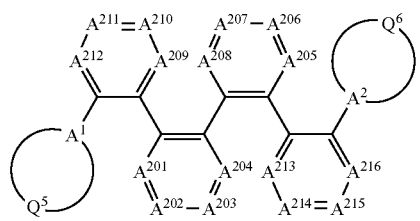

wherein $A^1$ and $A^2$ each independently represents a carbon atom or a nitrogen atom;

$Q^5$ and $Q^6$ each independently represents an atomic group for forming an aromatic hydrocarbon ring or an aromatic heterocyclic ring in combination with $A^1$ and $A^2$ respectively, provided that $Q^5$ and $Q^6$ are not combined through a single bond, a divalent aromatic hydrocarbon ring group or a divalent aromatic heterocyclic ring group;

$A^n$ (n=201 to 216) each independently represents N or C—$R''$ (n=201 to 216); and $R^{201}$ to $R^{216}$ each independently represents a hydrogen atom or a substituent.

[8] The organic electroluminescent device as described in [7] above, wherein the at least one compound represented by formula (2) is represented by formula (3):

Formula (3):

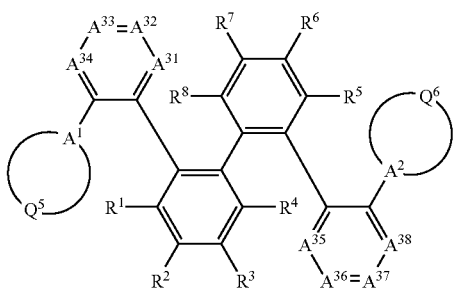

wherein $A^1$ and $A^2$ each independently represents a carbon atom or a nitrogen atom;

$Q^5$ and $Q^6$ each independently represents an atomic group for forming an aromatic hydrocarbon ring or an aromatic heterocyclic ring in combination with $A^1$ and $A^2$ respectively, provided that $Q^5$ and $Q^6$ are not combined through a single bond, a divalent aromatic hydrocarbon ring group or a divalent aromatic heterocyclic ring group;

$A^n$ (n=31 to 38) each independently represents N or C—$R''$ (n=31 to 38);

$R^{31}$ to $R^{38}$ each independently represents a hydrogen atom or a substituent; and $R^1$ to $R^8$ each independently represents a hydrogen atom or a substituent.

[9] The organic electroluminescent device as described in [8] above, wherein the at least one compound represented by formula (3) is represented by formula (4):

Formula (4):

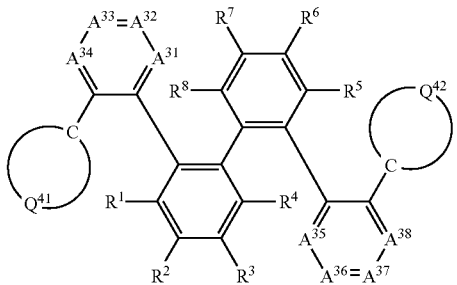

wherein $Q^{41}$ and $Q^{42}$ each independently represents an atomic group for forming an aromatic hydrocarbon ring or an aromatic heterocyclic ring in combination with the carbon atom in formula (4), provided that $Q^{41}$ and $Q^{42}$ are not combined through a single bond, a divalent aromatic hydrocarbon ring group or a divalent aromatic heterocyclic ring group;

$A^n$ (n=31 to 38) each independently represents N or C—$R''$ (n=31 to 38);

$R^{31}$ to $R^{38}$ each independently represents a hydrogen atom or a substituent; and $R^1$ to $R^8$ each independently represents a hydrogen atom or a substituent.

[10] The organic electroluminescent device as described in [9] above, wherein the at least one compound represented by formula (4) is represented by formula (5):

Formula (5):

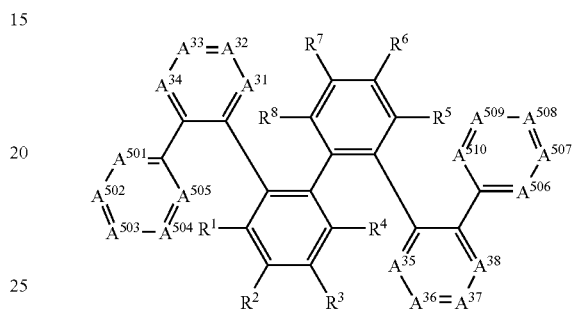

wherein $A^n$ (n=31 to 38 and 501 to 510) each independently represents N or C—$R''$ (n=31 to 38 and 501 to 510);

$R^{31}$ to $R^{38}$ and $R^{501}$ to $R^{510}$ each independently represents a hydrogen atom or a substituent; and $R^1$ to $R^8$ each independently represents a hydrogen atom or a substituent.

[11] The organic electroluminescent device as described in [4] above, wherein the phosphorescent material is a platinum complex of a tetradentate ligand.

[12] The organic electroluminescent device as described in [4] above, wherein the phosphorescent material is an iridium complex having a fluorine-substituted phenyl group in a ligand.

DETAILED DESCRIPTION OF THE INVENTION

The organic electroluminescent device of the present invention has at least one organic light-emitting layer (light-emitting layer) as an organic compound layer. As for the organic compound layer other than the light-emitting layer, for example, a hole injection layer, a hole transport layer, an electron blocking layer, an exciton blocking layer, a hole blocking layer, an electron transport layer, an electron injection layer and a protective layer may be appropriately disposed, and each layer may concurrently have a function of other layers. Also, each layer may be composed of a plurality of layers.

The organic electroluminescent device of the present invention may utilize either light emission from an excited singlet state (fluorescence) or light emission from an excited triplet state (phosphorescence) but in view of emission efficiency, preferably utilizes phosphorescence.

In the case where the organic electroluminescent device of the present invention utilizes phosphorescence, the light-emitting layer is preferably composed of at least one kind of phosphorescent material and at least one kind of host material. Here, the host material is a material other than the light-emitting material among the materials constituting the light-emitting layer and means a material having at least one function out of a function of holding the dispersed light-emitting material in the layer, a function of receiving a hole from an anode, a hole transport layer or the like, a function of receiving an electron from a cathode, an electron transport layer or the like, a function of transporting a hole and/or an electron, a function of providing a site for recombination of a hole and an electron, a function of transferring the energy of an exciton produced by the recombination to the light-emitting material, and a function of transporting a hole and/or an electron to the light-emitting material.

The compound of the present invention may be contained in any layer of the organic layers and may also be contained in a plurality of layers but is preferably contained in the light-emitting layer, hole blocking layer, electron transport layer or electron injection layer and most preferably contained as a host material in the light-emitting layer. In the case where the compound of the present invention is contained as a host material in the light-emitting layer, the content thereof is preferably from 50 to 99.9 mass %, more preferably from 60 to 99%. (In this specification, mass ratio is equal to weight ratio.) In the case where the compound of the present invention is contained in the hole blocking layer, electron transport layer and electron injection layer, the content thereof in each layer is preferably from 70 to 100%, more preferably from 85 to 100%, and most preferably 100%. Furthermore, in the case where the compound of the present invention is contained in the electron blocking layer, hole transport layer and hole injection layer, the content thereof in each layer is preferably from 70 to 100%, more preferably from 85 to 100%, and most preferably 100%.

The compound represented by formula (1) of the present invention is described in detail below.

Formula (1):

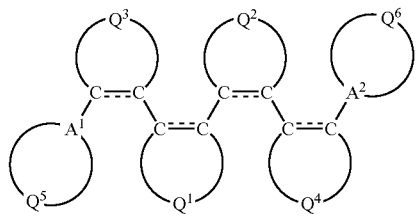

(wherein $Q^1$ to $Q^4$ each independently represents an atomic group for forming an aromatic hydrocarbon ring or aromatic heterocyclic ring in combination with two carbon atoms in the formula, $A^1$ and $A^2$ each independently represents a carbon atom or a nitrogen atom, $Q^5$ and $Q^6$ each independently represents an atomic group for forming an aromatic hydrocarbon ring or aromatic heterocyclic ring in combination with $A^1$ and $A^2$ respectively, and $Q^5$ and $Q^6$ are not combined through a single bond, a divalent aromatic hydrocarbon ring group or a divalent aromatic heterocyclic ring group).

$Q^1$ to $Q^4$ each independently represents an atomic group for forming an aromatic hydrocarbon ring or aromatic heterocyclic ring in combination with two carbon atoms in the formula. The aromatic hydrocarbon ring or aromatic heterocyclic ring constituted by $Q^1$, $Q^2$, $Q^3$ or $Q^4$ is not particularly limited but is preferably a 4- to 10-membered ring, more preferably a 5- to 7-membered ring, still more preferably a 5- or 6-membered ring, yet still more preferably a 6-membered ring. The heteroatom contained in the aromatic heterocyclic ring constituted by $Q^1$, $Q^2$, $Q^3$ or $Q^4$ is not particularly limited but is preferably nitrogen, oxygen, sulfur, selenium, silicon, germanium or phosphorus, more preferably nitrogen, oxygen or sulfur, still more preferably nitrogen or oxygen, yet still more preferably nitrogen. The number of heteroatoms contained in one aromatic heterocyclic ring constituted by $Q^1$, $Q^2$, $Q^3$ or $Q^4$ is not particularly limited but is preferably from 1 to 3.

Specific examples of the aromatic hydrocarbon ring or aromatic heterocyclic ring constituted by $Q^1$, $Q^2$, $Q^3$ or $Q^4$ include a benzene ring, a pyridine ring, a pyrazine ring, a pyrimidine ring, a pyridazine ring, a triazine ring, a pyrrole ring, a pyrazole ring, an imidazole ring, a triazole ring, an oxazole ring, an oxadiazole ring, a thiazole ring, a thiadiazole ring, a furan ring, a thiophene ring, a selenophene ring, a silole ring, a germole ring and a phosphole ring. The aromatic hydrocarbon ring or aromatic heterocyclic ring constituted by $Q^1$, $Q^2$, $Q^3$ or $Q^4$ is preferably a benzene ring, a pyridine ring, a pyrazine ring, a pyrimidine ring, a pyrrole ring, a pyrazole ring, an imidazole ring, an oxazole ring, a thiazole ring, a furan ring or a thiophene ring, more preferably a benzene ring, a pyridine ring, a pyrazine ring, a pyrimidine ring, an imidazole ring or a thiophene ring, still more preferably a benzene ring, a pyrimidine ring, a pyrazine ring or a pyrimidine ring, yet still more preferably a benzene ring, a pyridine ring or a pyrazine ring.

The aromatic hydrocarbon ring or aromatic heterocyclic ring constituted by $Q^1$, $Q^2$, $Q^3$ or $Q^4$ may have a substituent, and those in the following substituent group A may be applied as the substituent.

(Substituent Group A)

An alkyl group (preferably having a carbon number of 1 to 30, more preferably from 1 to 20, still more preferably from 1 to 10, e.g., methyl, ethyl, iso-propyl, tert-butyl, n-octyl, n-decyl, n-hexadecyl, cyclopropyl, cyclopentyl, cyclohexyl), an alkenyl group (preferably having a carbon number of 2 to 30, more preferably from 2 to 20, still more preferably from 2 to 10, e.g., vinyl, allyl, 2-butenyl, 3-pentenyl), an alkynyl group (preferably having a carbon number of 2 to 30, more preferably from 2 to 20, still more preferably from 2 to 10, e.g., propargyl, 3-pentynyl), an aryl group (preferably having a carbon number of 6 to 30, more preferably from 6 to 20, still more preferably from 6 to 12, e.g., phenyl, p-methylphenyl, naphthyl, anthranyl), an amino group (preferably having a carbon number of 0 to 30, more preferably from 0 to 20, still more preferably from 0 to 10, e.g., amino, methylamino, dimethylamino, diethylamino, dibenzylamino, diphenylamino, ditolylamino), an alkoxy group (preferably having a carbon number of 1 to 30, more preferably from 1 to 20, still more preferably from 1 to 10, e.g., methoxy, ethoxy, butoxy, 2-ethylhexyloxy), an aryloxy group (preferably having a carbon number of 6 to 30, more preferably from 6 to 20, still more preferably from 6 to 12, e.g., phenyloxy, 1-naphthyloxy, 2-naphthyloxy), a heterocyclic oxy group (preferably having a carbon number of 1 to 30, more preferably from 1 to 20, still more preferably from 1 to 12, e.g., pyridyloxy, pyrazyloxy, pyrimidyloxy, qunolyloxy), an acyl group (preferably having a carbon number of 1 to 30, more preferably from 1 to 20, still more preferably from 1 to 12, e.g., acetyl, benzoyl, formyl, pivaloyl), an alkoxycarbonyl group (preferably having a carbon number of 2 to 30, more preferably from 2 to 20, still more preferably from 2 to 12, e.g., methoxycarbonyl, ethoxycarbonyl), an aryloxycarbonyl group (preferably having a carbon number of 7 to 30, more preferably from 7 to 20, still more preferably from 7 to 12, e.g., phenyloxycarbonyl), an acyloxy group (preferably having a carbon number of 2 to 30, more preferably from 2 to 20, still more preferably from 2 to 10, e.g., acetoxy, benzoyloxy), an acylamino group (preferably having a carbon number of 2 to 30, more preferably from 2 to 20, still more preferably from 2 to 10, e.g., acetylamino, benzoylamino), an alkoxycarbonylamino group (preferably having a carbon number of 2 to 30, more preferably from 2 to 20, still more preferably from 2 to 12, e.g., methoxycarbonylamino), an aryloxycarbonylamino group (preferably having a carbon number of 7 to 30, more preferably from 7 to 20, still more preferably from 7 to 12, e.g., phenyloxycarbonylamino), a sulfonylamino group (preferably having a carbon number of 1 to 30, more preferably from 1 to 20, still more preferably from 1 to 12, e.g., methanesulfonylamino, benzenesulfonylamino), a sulfamoyl group (preferably having a carbon number of 0 to 30, more preferably from 0 to 20, still more preferably from 0 to 12, e.g., sulfamoyl, methylsulfamoyl, dimethylsulfamoyl, phenylsulfamoyl), a carbamoyl group (preferably having a carbon number of 1 to 30, more preferably from 1 to 20, still more preferably from 1 to 12, e.g., carbamoyl, methylcarbamoyl, diethylcarbamoyl, phenylcarbamoyl), an alkylthio group (preferably having a carbon number of 1 to 30, more preferably from 1 to 20, still more preferably from 1 to 12, e.g., methylthio, ethylthio), an arylthio group (preferably having a carbon number of 6 to 30, more preferably from 6 to 20, still more preferably from 6 to 12, e.g., phenylthio), a heterocyclic thio group (preferably having a carbon number of 1 to 30, more preferably from 1 to 20, still more preferably from 1 to 12, e.g., pyridylthio, 2-benzimidazolylthio, 2-benzoxazolylthio, 2-benzothiazolylthio), a sulfonyl group (preferably having a carbon number of 1 to 30, more preferably from 1 to 20, still more preferably from 1 to 12, e.g., mesyl, tosyl), a sulfinyl group (preferably having a carbon number of 1 to 30, more preferably from 1 to 20, still more preferably from 1 to 12, e.g., methanesulfinyl, benzenesulfinyl), a ureido group (preferably having a carbon number of 1 to 30, more preferably from 1 to 20, still more preferably from 1 to 12, e.g., ureido, methylureido, phenylureido), a phosphoric acid amido group (preferably having a carbon number of 1 to 30, more preferably from 1 to 20, still more preferably from 1 to 12, e.g., diethylphosphoric acid amido, phenylphosphoric acid amido), a hydroxyl group, a mercapto group, a halogen atom (e.g., fluorine, chlorine, bromine, iodine), a cyano group, a sulfo group, a carboxyl group, a nitro group, a hydroxamic acid group, a sulfino group, a hydrazino group, an imino group, a heterocyclic group (preferably having a carbon number of 1 to 30, more preferably from 1 to 12, with the heteroatom being, for example, nitrogen atom, oxygen atom or sulfur atom; e.g., imidazolyl, pyridyl, quinolyl, furyl, thienyl, piperidyl, morpholino, benzoxazolyl, benzimidazolyl, benzothiazolyl, carbazolyl, azepinyl), a silyl group (preferably having a carbon number of 3 to 40, more preferably from 3 to 30, still more preferably from 3 to 24, e.g., trimethylsilyl, triphenylsilyl), and a silyloxy group (preferably having a carbon number of 3 to 40, more preferably from 3 to 30, still more preferably from 3 to 24, e.g., trimethylsilyloxy, triphenylsilyloxy).

The substituent of the aromatic hydrocarbon ring or aromatic heterocyclic ring constituted by $Q^1$, $Q^2$, $Q^3$ or $Q^4$ is preferably an alkyl group, an aryl group, an amino group, an alkoxy group, an aryloxy group, a heterocyclic oxy group, an acyl group, an alkylthio group, an arylthio group, a heterocyclic thio group, a sulfonyl group, a halogen atom, a cyano group, a heterocyclic group or a silyl group, more preferably an alkyl group, an aryl group, an alkoxy group, a halogen atom, a cyano group, a heterocyclic group or a silyl group, still more preferably an alkyl group, an aryl group, a cyano group, a heterocyclic group or a silyl group, yet still more preferably an alkyl group, an aryl group, a cyano group or a heterocyclic group.

The aromatic hydrocarbon ring or aromatic heterocyclic ring constituted by $Q^1$, $Q^2$, $Q^3$ or $Q^4$ may form a condensed ring with another ring. Examples of the ring condensed with include a benzene ring, a pyridine ring, a pyrazine ring, a pyrimidine ring, a pyridazine ring, a pyrrole ring, a pyrazole ring, an imidazole ring, a triazole ring, an oxazole ring, an oxadiazole ring, a thiazole ring, a thiadiazole ring, a furan ring, a thiophene ring, a selenophene ring, a silole ring, a germole ring and a phosphole ring. The ring condensed with is preferably a benzene ring, a pyridine ring or a pyrazine ring. It is most preferred that the aromatic hydrocarbon ring or aromatic heterocyclic ring constituted by $Q^1$, $Q^2$, $Q^3$ or $Q^4$ does not form a condensed ring with another ring.

The above-described substituents and condensed rings each may further have a substituent or may be further condensed with another ring.

The aromatic hydrocarbon ring or aromatic heterocyclic ring constituted by $Q^1$, $Q^2$, $Q^3$ or $Q^4$ is preferably a benzene ring, a pyridine ring, a pyrazine ring, a pyrimidine ring, a triazine ring, a pyrrole ring, a pyrazole ring, an imidazole ring, a triazole ring, an oxazole ring, a thiazole ring, a furan ring or a thiophene ring, more preferably a benzene ring, a pyridine ring, a pyrazine ring, a pyrrole ring, a pyrazole ring, an imidazole ring, an oxazole ring, a thiazole ring or a thiophene ring, still more preferably a benzene ring, a pyridine ring, a pyrazine ring, a pyrazole ring, an imidazole ring or a thiophene ring, yet still more preferably a benzene ring, a pyridine ring or a pyrazine ring.

$A^1$ and $A^2$ each independently represents a carbon atom or a nitrogen atom. $Q^5$ and $Q^6$ each independently represents an atomic group for forming an aromatic hydrocarbon ring or aromatic heterocyclic ring in combination with $A^1$ or $A^2$. Specific examples of the aromatic hydrocarbon ring or aromatic heterocyclic ring formed by $A^1$ and $Q^5$ and the aromatic hydrocarbon ring or aromatic heterocyclic ring formed by $A^2$ and $Q^6$ include a benzene ring, a pyridine ring, a pyrazine ring, a pyrimidine ring, a pyridazine ring, a triazine ring, a pyrrole ring, a pyrazole ring, an imidazole ring, a triazole ring, an oxazole ring, an oxadiazole ring, a thiazole ring, a thiadiazole ring, a furan ring, a thiophene ring, a selenophene ring, a silole ring, a germole ring and a phosphole ring. The aromatic hydrocarbon ring or aromatic heterocyclic ring formed by $A^1$ and $Q^5$ and the aromatic hydrocarbon ring or aromatic heterocyclic ring formed by $A^2$ and $Q^6$ each is, when $A^1$ and $A^2$ are a carbon atom, preferably a benzene ring, a pyridine ring, a pyrazine ring, a pyrimidine ring, a pyrrole ring, a pyrazole ring, an imidazole ring, an oxazole ring, a thiazole ring, a furan ring or a thiophene ring, more preferably a benzene ring, a pyridine ring, a pyrazine ring, a pyrimidine ring, an imidazole ring or a thiophene ring, still more preferably a benzene ring, a pyrimidine ring, a pyrazine ring or an imidazole ring, yet still more preferably a benzene ring, a pyridine ring or a pyrazine ring, and when $A^1$ and $A^2$ are a nitrogen atom, preferably an imidazole ring, a pyrazole ring, a triazole ring or a pyrrole ring, more preferably an imidazole ring, a pyrazole ring or a triazole ring, still more preferably an imidazole ring or a pyrazole ring, yet still more preferably an imidazole ring.

$Q^5$ and $Q^6$ are not combined through a single bond or a divalent aromatic hydrocarbon ring group or aromatic heterocyclic ring group. That is, formula (1) does not represent a cyclic hexaarylene compound. Also, the pairs of $Q^1$ and $Q^4$, $Q^1$ and $Q^1$, $Q^2$ and $Q^3$, and $Q^2$ and $Q^6$ each are preferably not combined through a single bond.

The aromatic hydrocarbon ring or aromatic heterocyclic ring formed by $A^1$ and $Q^5$ and the aromatic hydrocarbon ring or aromatic heterocyclic ring formed by $A^2$ and $Q^6$ each may have a substituent. As for the substituent, those described in the substituent group A above may be applied, and the preferred range thereof is the same as the preferred range of the substituent possessed by the aromatic hydrocarbon ring Ior aromatic heterocyclic ring constituted by $Q^1$, $Q^2$, $Q^3$ or $Q^4$.

The aromatic hydrocarbon ring or aromatic heterocyclic ring formed by $A^1$ and $Q^5$ and the aromatic hydrocarbon ring or aromatic heterocyclic ring formed by $A^2$ and $Q^6$ each may form a condensed ring with another ring. As for the ring condensed with, those described above as the ring condensed to the aromatic hydrocarbon ring or aromatic heterocyclic ring constituted by $Q^1$, $Q^2$, $Q^3$ or $Q^4$ may be applied, and the preferred range thereof is also the same. It is most preferred that the aromatic hydrocarbon ring or aromatic heterocyclic ring formed by $A^1$ and $Q^5$ and the aromatic hydrocarbon ring or aromatic heterocyclic ring formed by $A^2$ and $Q^6$ each does not form a condensed ring with another ring.

The compound represented by formula (1) is preferably a compound represented by formula (2):

Formula (2):

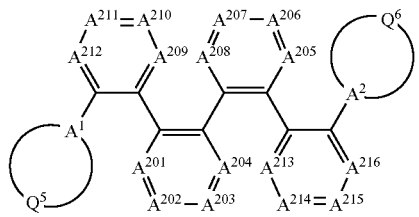

(wherein $A^1$ and $A^2$ each independently represents a carbon atom or a nitrogen atom, $Q^5$ and $Q^6$ each independently represents an atomic group for forming an aromatic hydrocarbon ring or aromatic heterocyclic ring in combination with $A^1$ and $A^2$ respectively, $Q^5$ and $Q^6$ are not combined through a single bond, a divalent aromatic hydrocarbon ring group or a divalent aromatic heterocyclic ring group, $A^n$ (n=201 to 216) each independently represents N or C—$R^n$ (n=201 to 216), and $R^{201}$ to $R^{216}$ each independently represents a hydrogen atom or a substituent).

Formula (2) is described below.

In the formula, $A^1$, $A^2$, $Q^5$ and $Q^6$ have the same meanings as those in formula (1), and preferred ranges are also the same. $A^n$ (n=201 to 216) each independently represents N or C—$R^n$ (n=201 to 216), and $R^{201}$ to $R^{216}$ each independently represents a hydrogen atom or a substituent. As for the substituent represented by $R^{201}$ to $R^{216}$, those described in the substituent group A above may be applied. $R^{201}$ to R216 each is preferably a hydrogen atom, an alkyl group, an aryl group, an amino group, an alkoxy group, an aryloxy group, a heterocyclic oxy group, an acyl group, an alkylthio group, an arylthio group, a heterocyclic thio group, a sulfonyl group, a halogen atom, a cyano group, a heterocyclic group or a silyl group, more preferably a hydrogen atom, an alkyl group, an aryl group, an alkoxy group, a halogen atom, a cyano group, a heterocyclic group or a silyl group, still more preferably a hydrogen atom, an alkyl group, an aryl group, a cyano group, a heterocyclic group or a silyl group, yet still more preferably a hydrogen atom, an alkyl group, an aryl group, a cyano group or a heterocyclic group.

$A^{201}$ to $A^{208}$ are preferably C—$R^{201}$ to C—$R^{208}$. $A^{209}$ to $A^{212}$ are preferably such that all are C—$R^n$ (n=209 to 212) or one or two of $A^{209}$ to $A^{212}$ is(are) N. Similarly, $A^{213}$ to $A^{216}$ are preferably such that all are C—$R^n$ (n=213 to 216) or one or two of $A^{213}$ to $A^{216}$ is(are) N.

The compound represented by formula (2) is more preferably a compound represented by formula (3):

Formula (3):

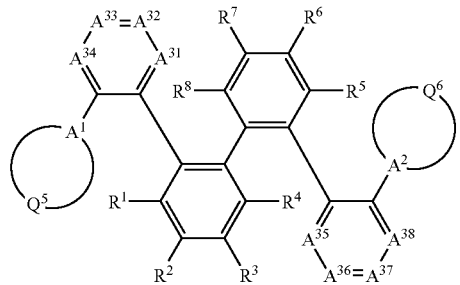

(wherein $A^1$ and $A^2$ each independently represents a carbon atom or a nitrogen atom, $Q^5$ and $Q^6$ each independently represents an atomic group for forming an aromatic hydrocarbon ring or aromatic heterocyclic ring in combination with $A^1$ and $A^2$ respectively, $Q^5$ and $Q^6$ are not combined through a single bond, a divalent aromatic hydrocarbon ring group or a divalent aromatic heterocyclic ring group, $A^n$ (n=31 to 38) each independently represents N or C—$R^n$ (n=31 to 38), $R^{31}$ to $R^{38}$ each independently represents a hydrogen atom or a substituent, and $R^1$ to $R^8$ each independently represents a hydrogen atom or a substituent).

The compound represented by formula (3) is described below.

In the formula, $A^1$, $A^2$, $Q^5$ and $Q^6$ have the same meanings as those in formula (1), and preferred ranges are also the same. $R^1$ to $R^8$ each independently represents a hydrogen atom or a substituent. As for the substituent represented by $R^1$ to $R^8$, those described in the substituent group A above may be applied. $R^1$ to $R^8$ each is preferably a hydrogen atom, an alkyl group, an aryl group, an amino group, an alkoxy group, an aryloxy group, a heterocyclic oxy group, an acyl group, an alkylthio group, an arylthio group, a heterocyclic thio group, a sulfonyl group, a halogen atom, a cyano group, a heterocyclic group or a silyl group, more preferably a hydrogen atom, an alkyl group, an aryl group, an alkoxy group, a halogen atom, a cyano group, a heterocyclic group or a silyl group, still more preferably a hydrogen atom, an alkyl group, an aryl group, a cyano group, a heterocyclic group or a silyl group, yet still more preferably a hydrogen atom, an alkyl group, an aryl group, a cyano group or a heterocyclic group. $A^{31}$ to $A^{34}$ have the same meanings as $A^{209}$ to $A^{212}$ in formula (2), and preferred ranges are also the same. Similarly, $A^{35}$ to $A^{38}$ have the same meanings as $A^{213}$ to $A^{216}$ in formula (2), and preferred ranges are also the same.

The compound represented by formula (3) is more preferably a compound represented by formula (4):

Formula (4):

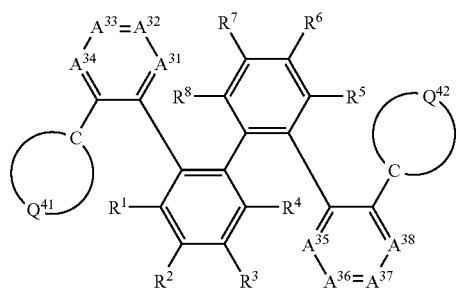

(wherein $Q^{41}$ and $Q^{42}$ each independently represents an atomic group for forming an aromatic hydrocarbon ring or aromatic heterocyclic ring in combination with the carbon atom, $Q^{41}$ and $Q^{42}$ are not combined through a single bond, a divalent aromatic hydrocarbon ring group or a divalent aromatic heterocyclic ring group, $A''$ (n=31 to 38) each independently represents N or C—$R''$ (n=31 to 38), $R^{31}$ to $R^{38}$ each independently represents a hydrogen atom or a substituent, and $R^1$ to $R^8$ each independently represents a hydrogen atom or a substituent).

The compound represented by formula (4) is described below.

$R^1$ to $R^8$ and $A^{31}$ to $A^{38}$ have the same meanings as those in formula (3), and preferred ranges are also the same. $Q^{41}$ and $Q^{42}$ each independently represents an atomic group for forming an aromatic hydrocarbon ring or aromatic heterocyclic ring in combination with the carbon atom. Examples of the aromatic hydrocarbon ring or aromatic heterocyclic ring by $Q^{41}$ or $Q^{42}$ include a benzene ring, a pyridine ring, a pyrazine ring, a pyrimidine ring, a pyridazine ring, a triazine ring, a pyrrole ring, a pyrazole ring, an imidazole ring, a triazole ring, an oxazole ring, an oxadiazole ring, a thiazole ring, a thiadiazole ring, a furan ring, a thiophene ring, a selenophene ring, a silole ring, a germole ring and a phosphole ring. The aromatic hydrocarbon ring or aromatic heterocyclic ring formed by $Q^{41}$ or $Q^{42}$ is preferably a benzene ring, a pyridine ring, a pyrazine ring, a pyrimidine ring, a pyrrole ring, a pyrazole ring, an imidazole ring, an oxazole ring, a thiazole ring, a furan ring or a thiophene ring, more preferably a benzene ring, a pyridine ring, a pyrazine ring, a pyrimidine ring, an imidazole ring or a thiophene ring, still more preferably a benzene ring, a pyrimidine ring, a pyrazine ring or an imidazole ring, yet still more preferably a benzene ring, a pyridine ring or a pyrazine ring.

The compound represented by formula (4) is more preferably a compound represented by formula (5):

Formula (5):

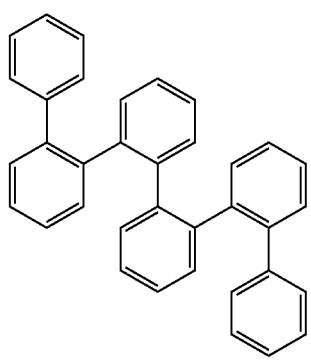

(wherein $A''$ (n=31 to 38 and 501 to 510) each independently represents N or C—$R''$ (n=31 to 38 and 501 to 510), $R^{31}$ to $R^{38}$ and $R^{501}$ to $R^{510}$ each independently represents a hydrogen atom or a substituent, and $R^1$ to $R^8$ each independently represents a hydrogen atom or a substituent).

The compound represented by formula (5) is described below.

$R^1$ to $R^8$ and $A^{31}$ to $A^{38}$ have the same meanings as those in formula (3), and preferred ranges are also the same. $A''$ (n=501 to 510) each independently represents N or C—$R''$ (n=501 to 510), and $R^{501}$ to $R^{510}$ each independently represents a hydrogen atom or a substituent. As for the substituent represented by $R^{501}$ to $R^{510}$, those described in the substituent group A above may be applied. $R^{501}$ to $R^{510}$ each is preferably a hydrogen atom, an alkyl group, an aryl group, an amino group, an alkoxy group, an aryloxy group, a heterocyclic oxy group, an acyl group, an alkylthio group, an arylthio group, a heterocyclic thio group, a sulfonyl group, a halogen atom, a cyano group, a heterocyclic group or a silyl group., more preferably a hydrogen atom, an alkyl group, an aryl group, an alkoxy group, a halogen atom, a cyano group, a heterocyclic group or a silyl group, still more preferably a hydrogen atom, an alkyl group, an aryl group, a cyano group, a heterocyclic group or a silyl group, yet still more preferably a hydrogen atom, an alkyl group, an aryl group, a cyano group or a heterocyclic group.

Specific examples of the compounds represented by formulae (1) to (5) are set forth below, but the present invention is not limited thereto. (Incidentally, Ph denotes a phenyl group, and $^t$Bu denotes a tertiary butyl group.)

1.

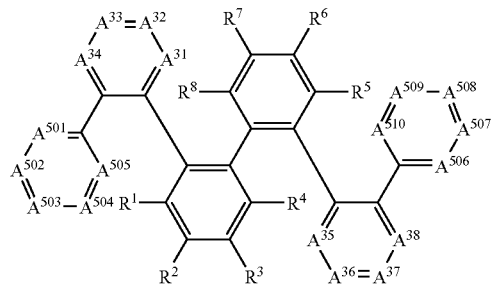

2.

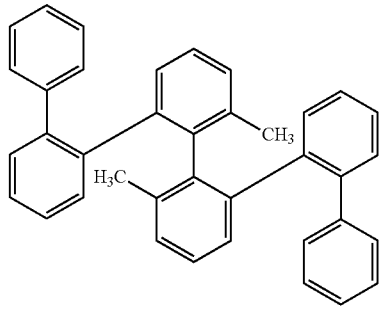

3.

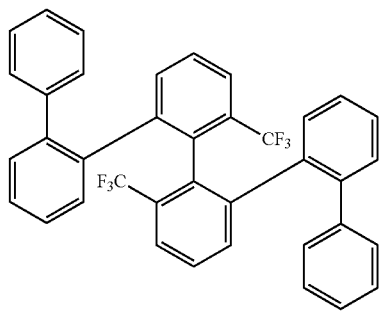

4.

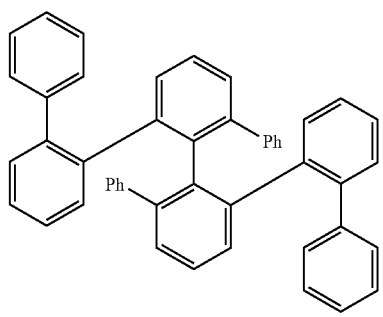

5.
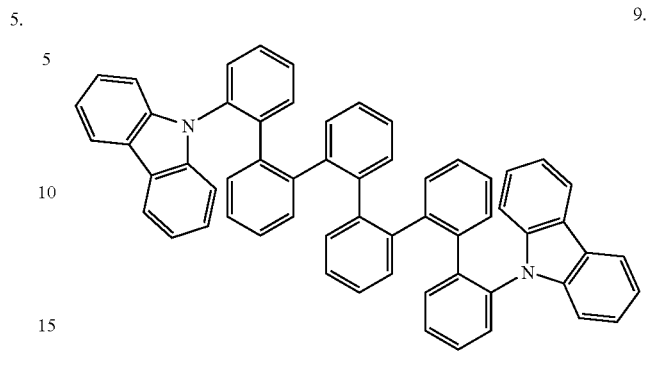
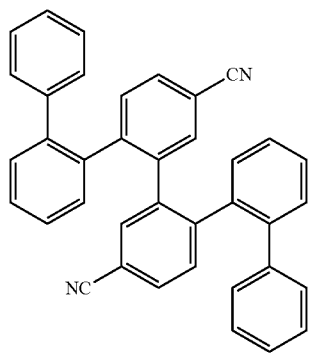
6.
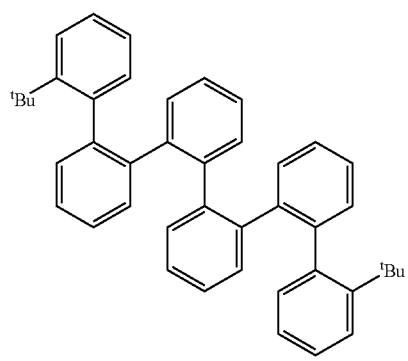
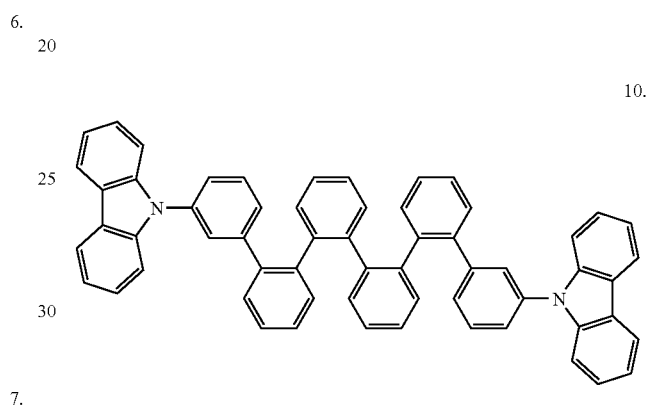
7.
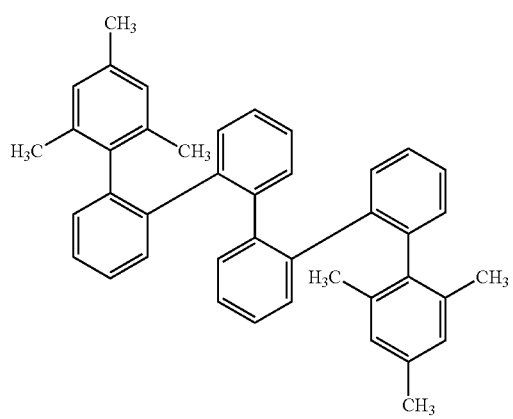
9.
10.
11.
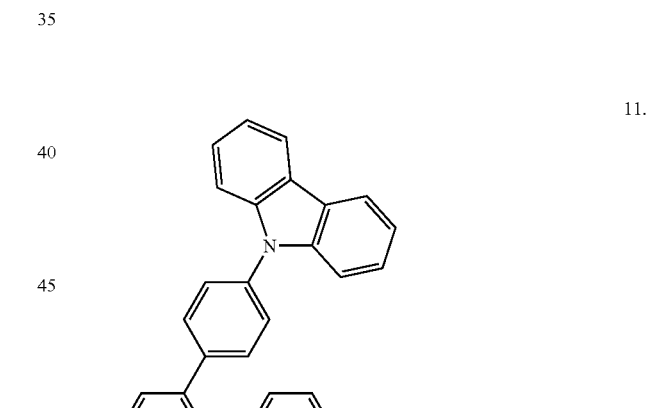
8.
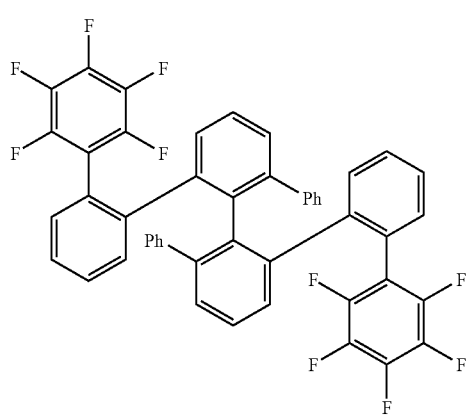
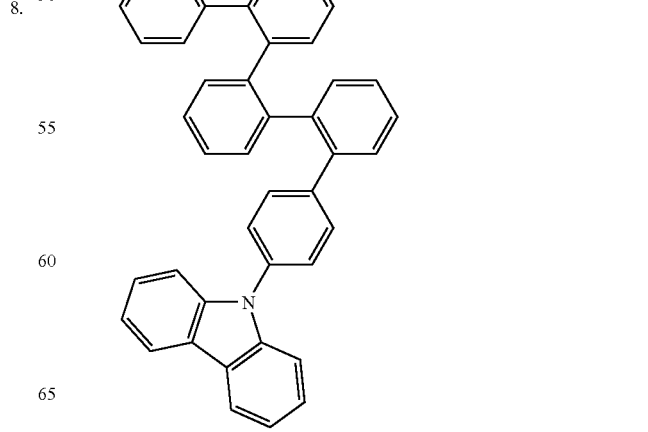

12.
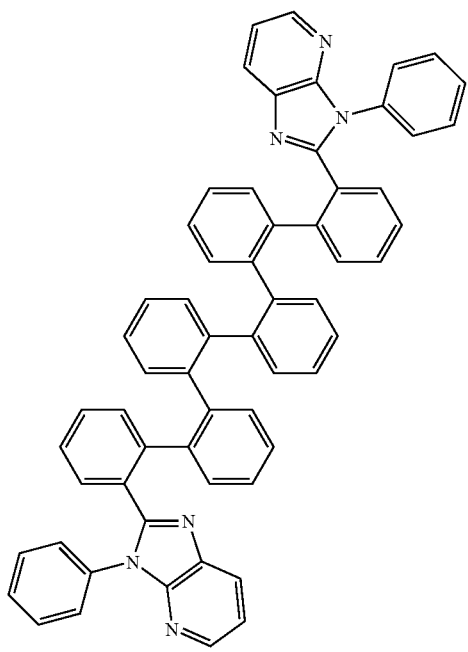
13.
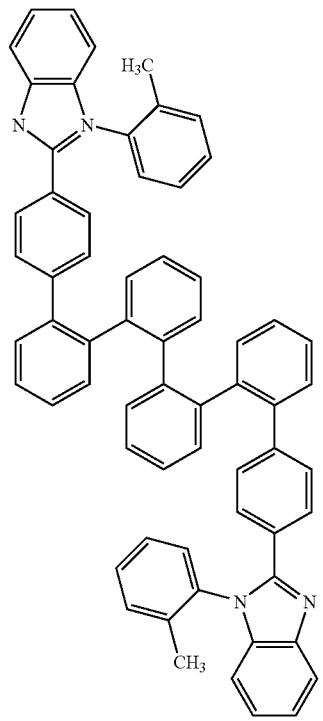
14.
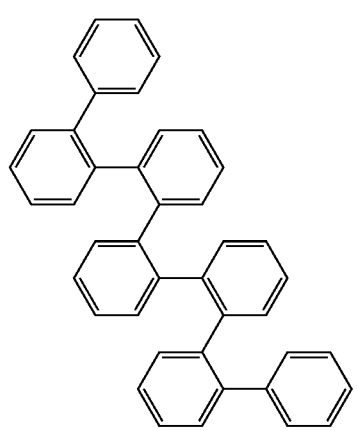
15.
16.
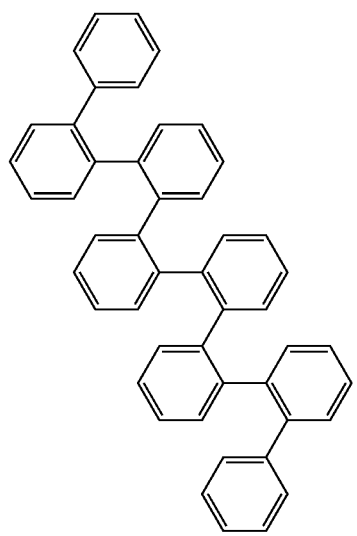

17.
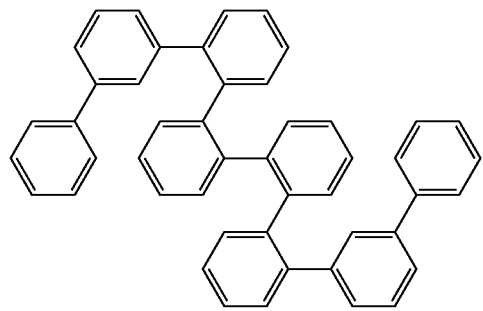
18.
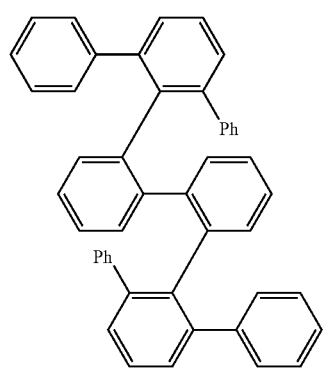
19.
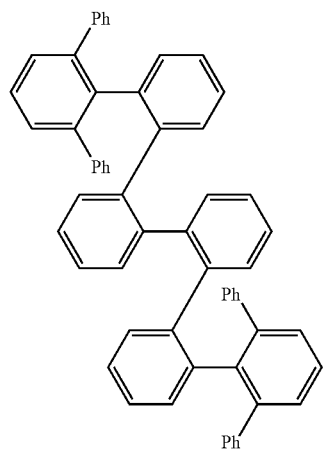
20.
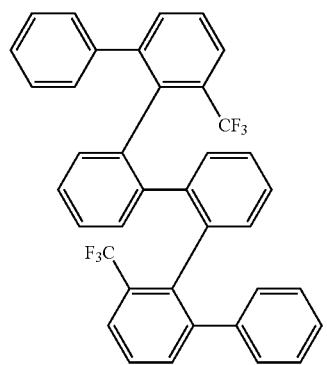
21.
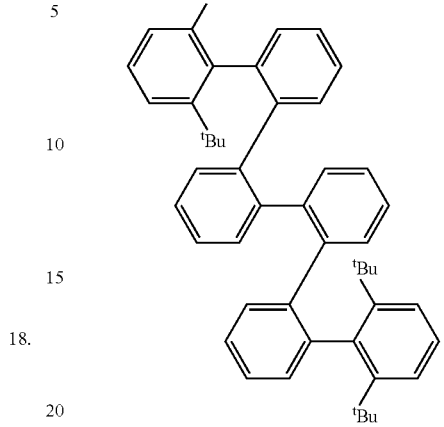
22.
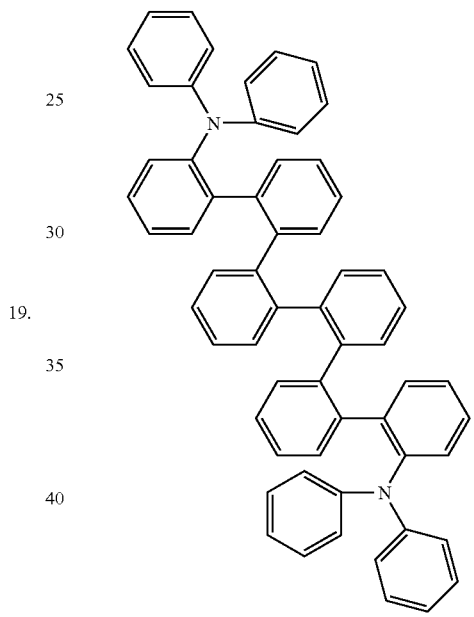
23.
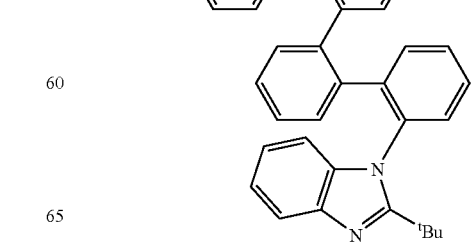

24.
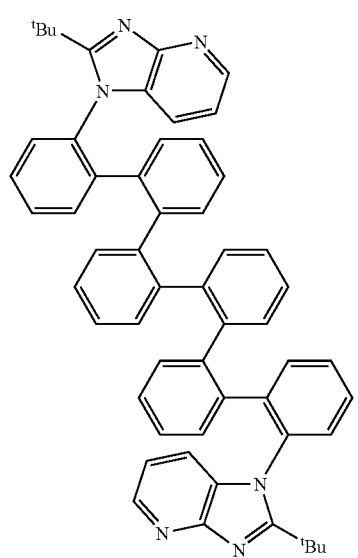
25.
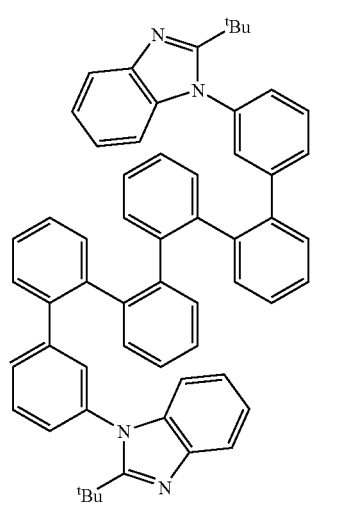
26.
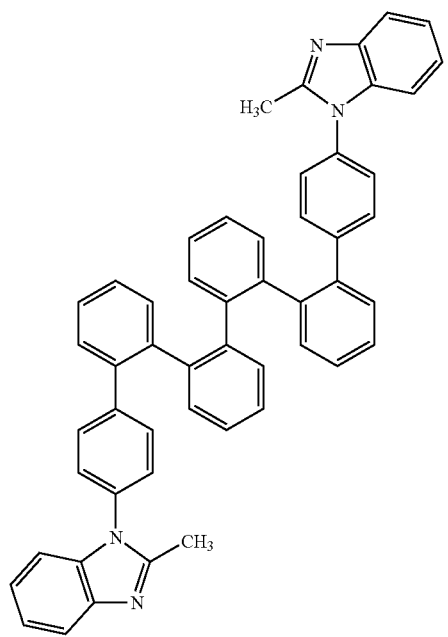
27.
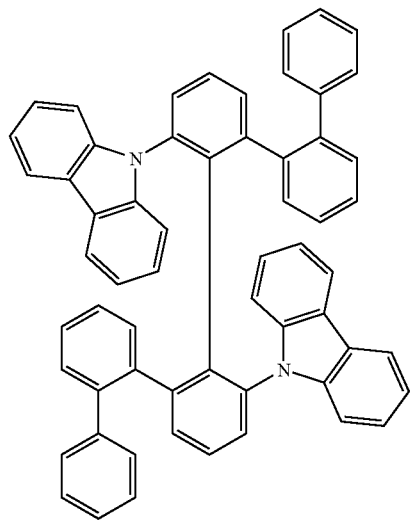
28.
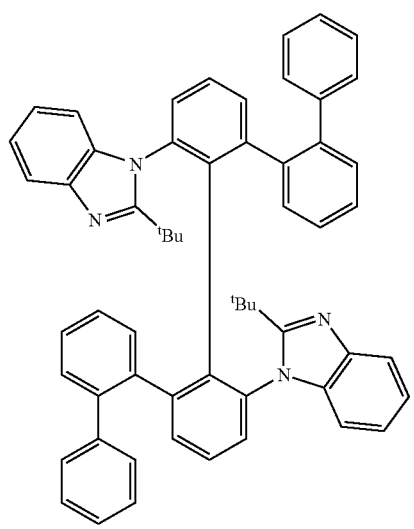
29.
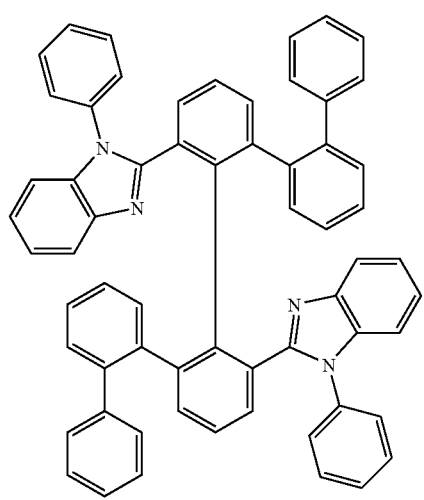

30.
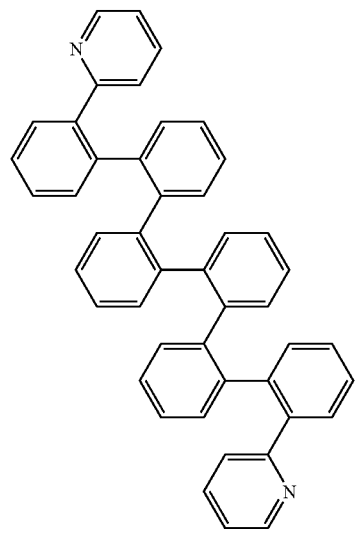
31.
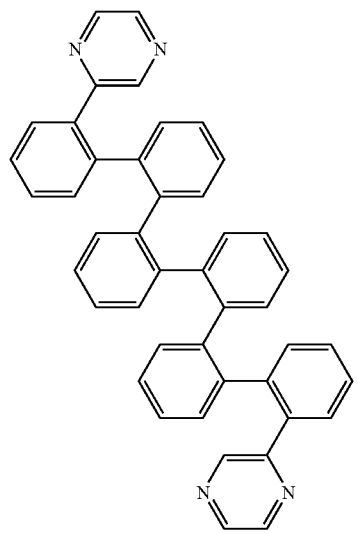
32.
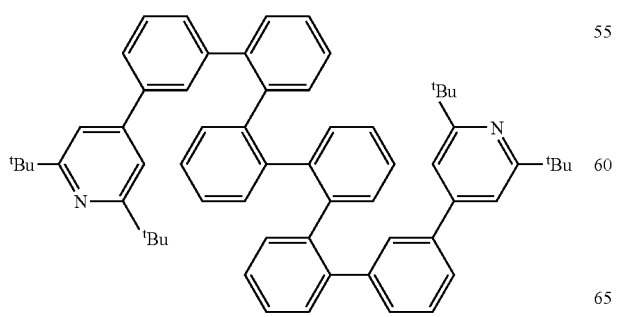
33.
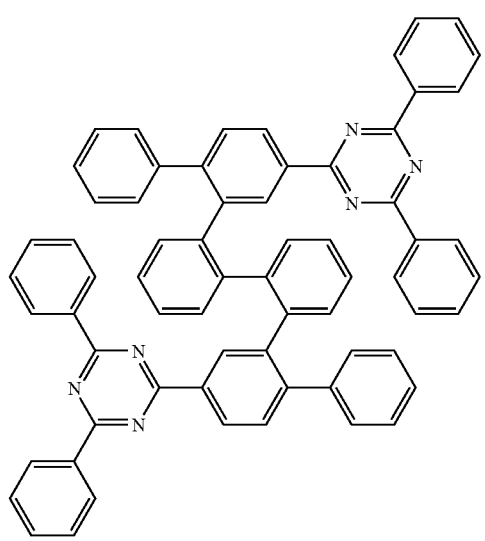
34.
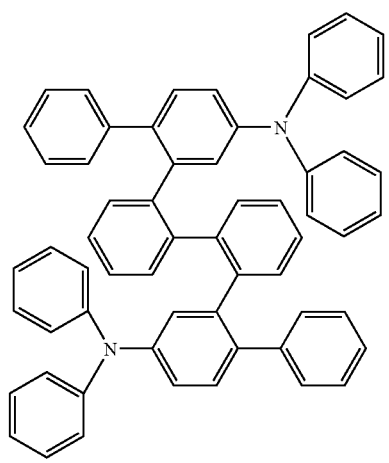
35.
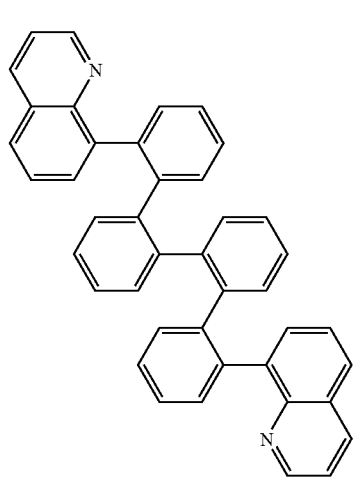

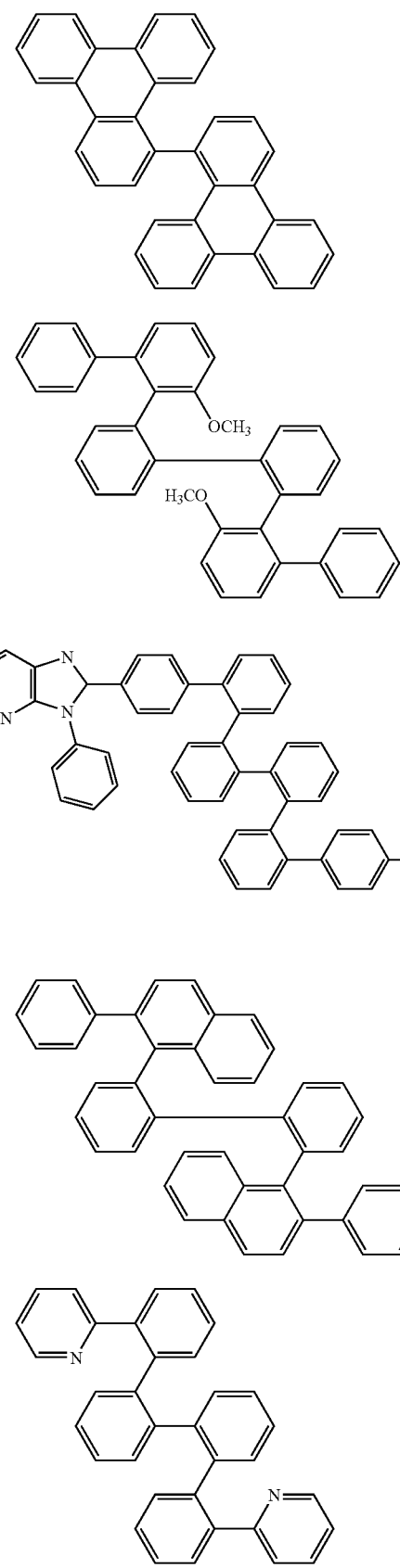
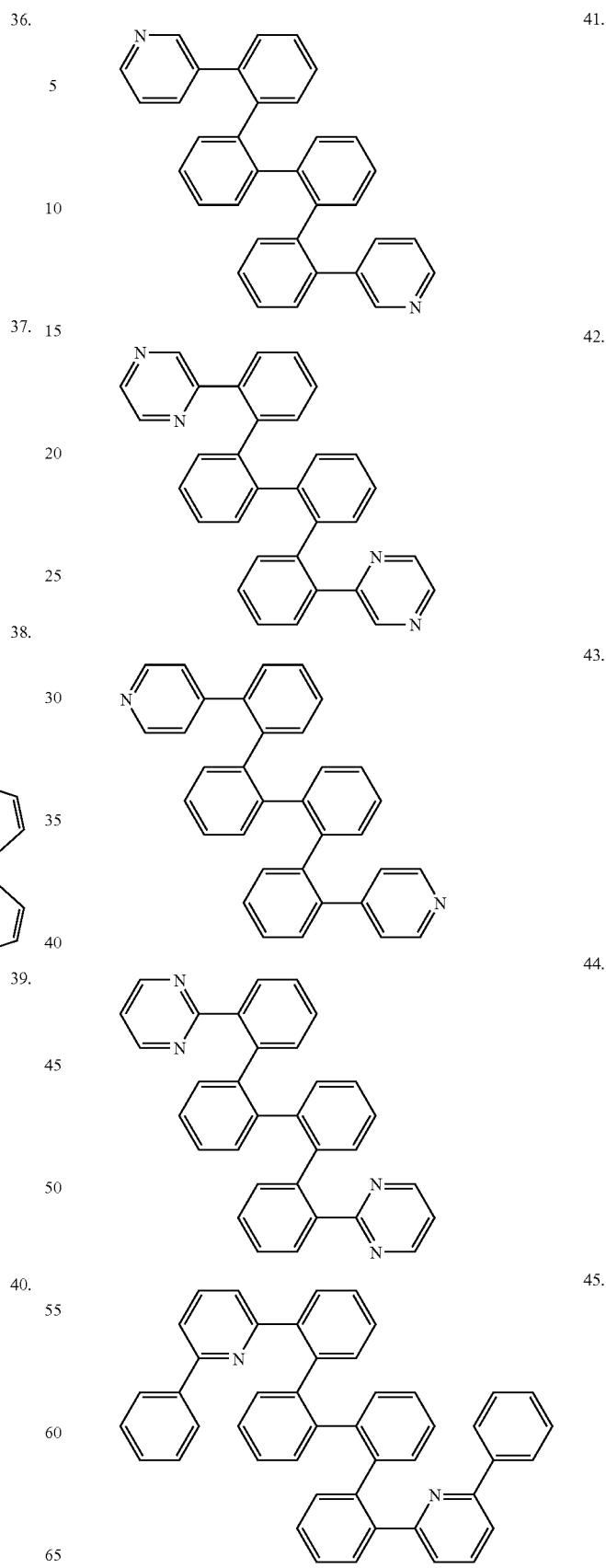

46. 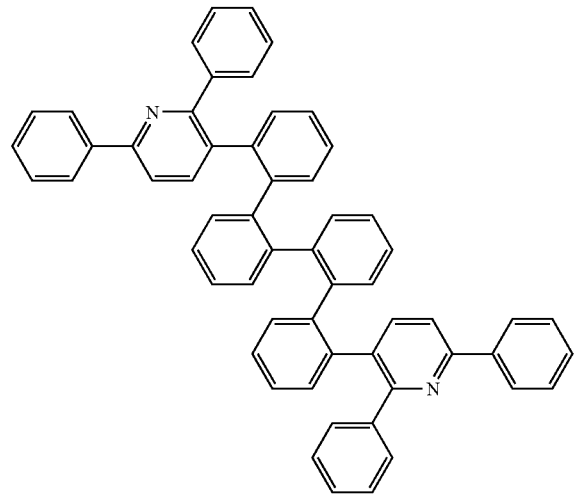
47. 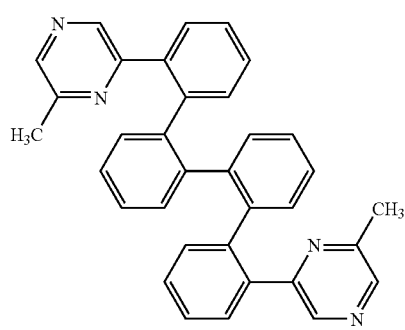
48. 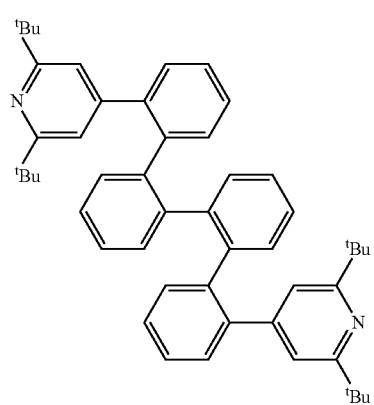
49. 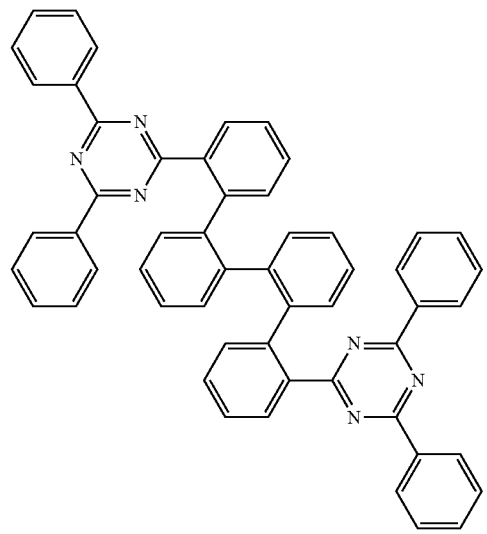
50. 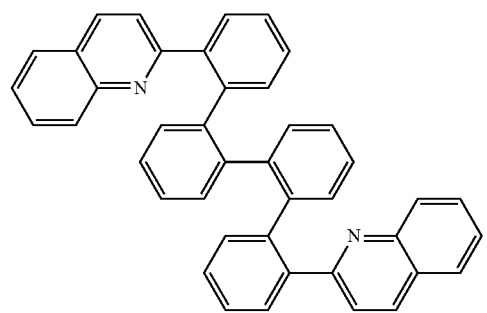
51. 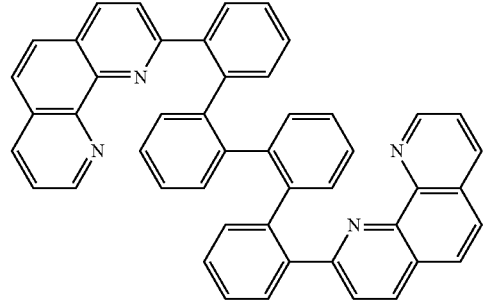
52. 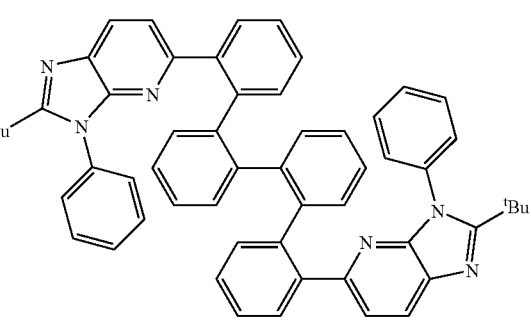

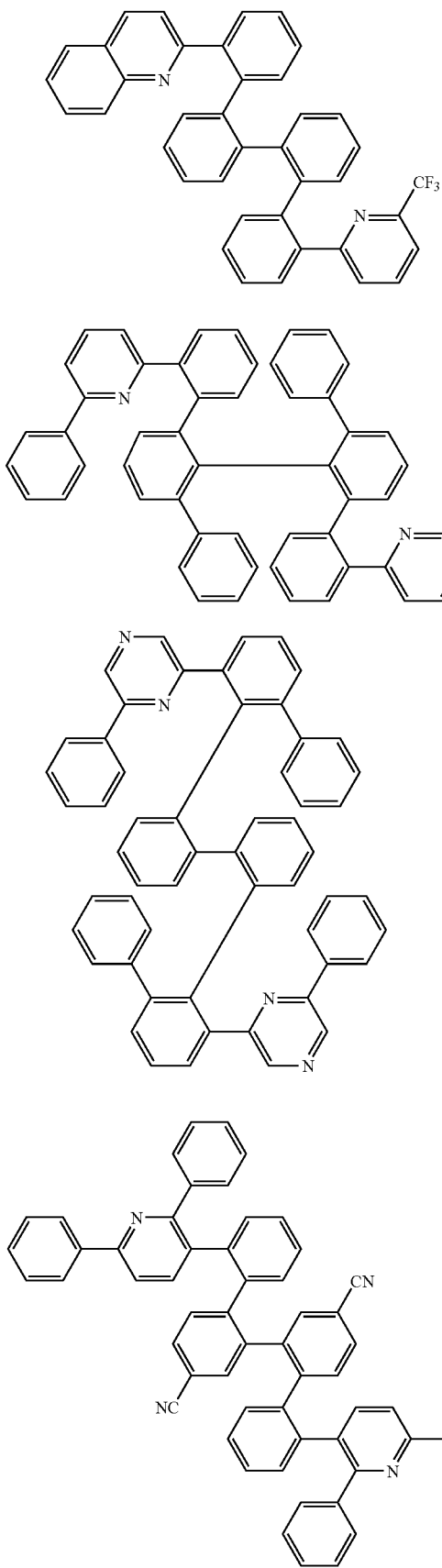
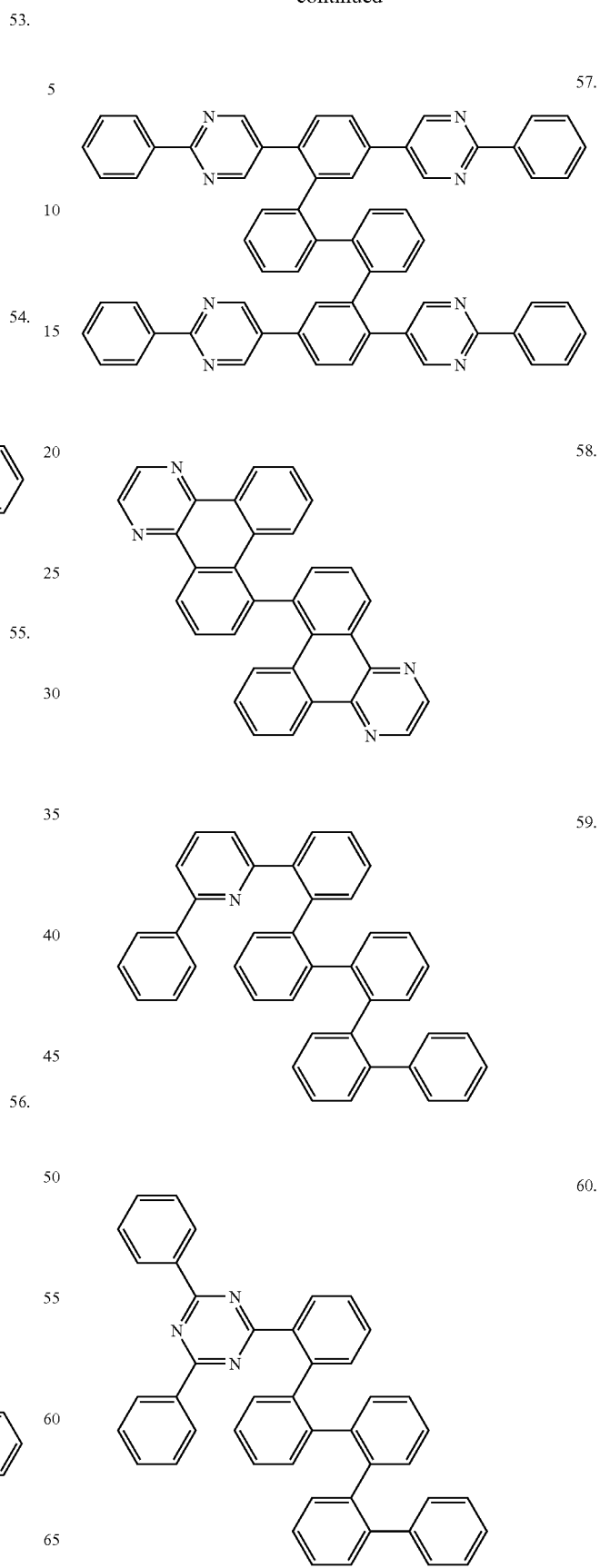

61.
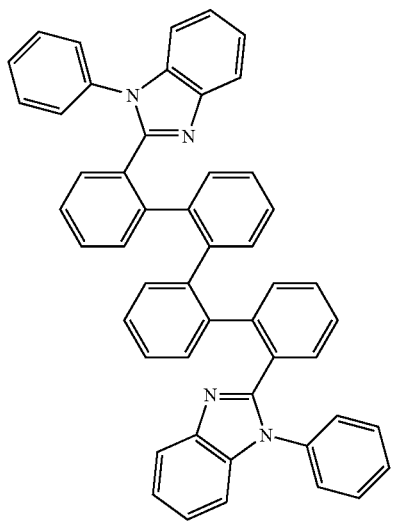
62.
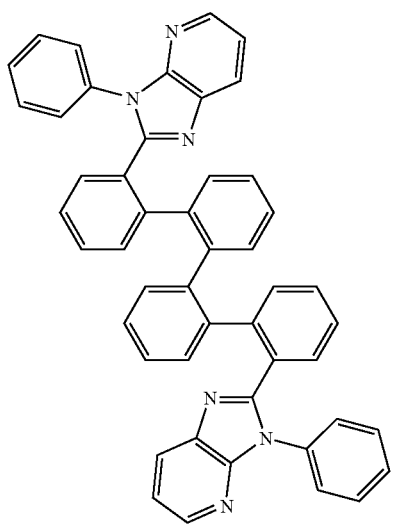
63.
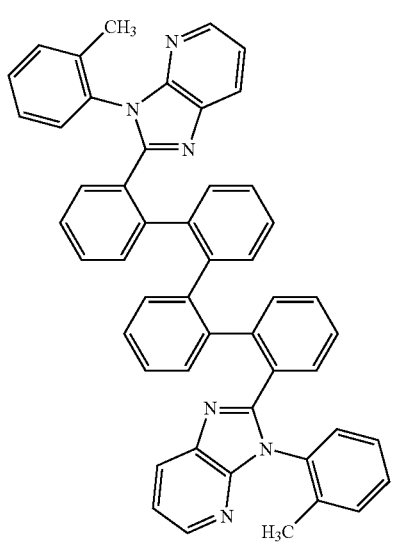
64.
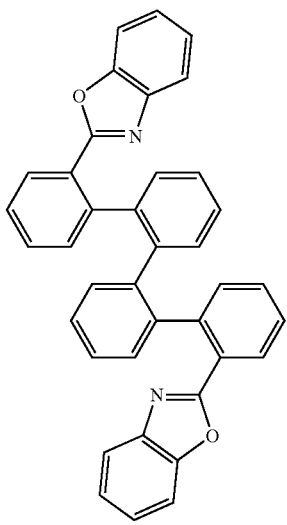
65.
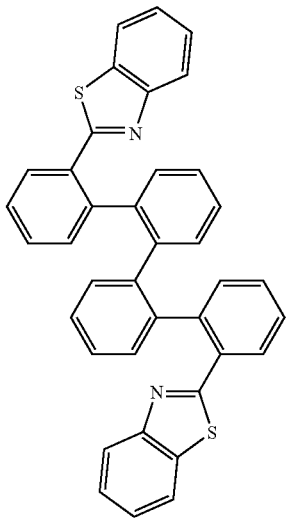
66.
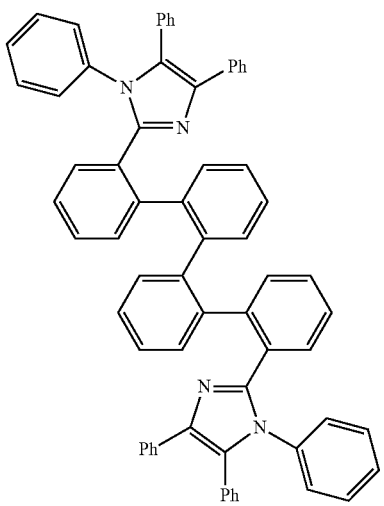

67.
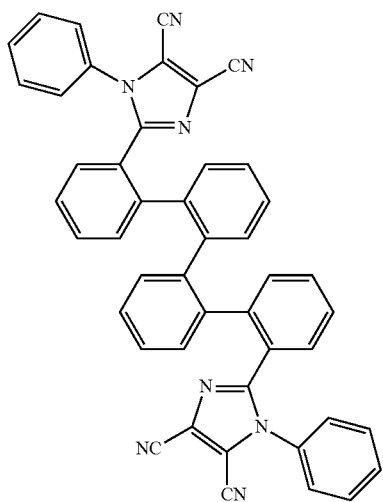
68.
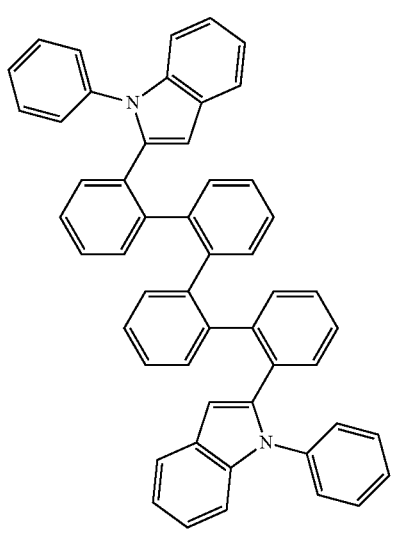
69.
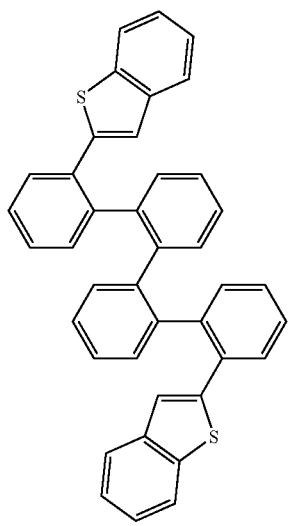
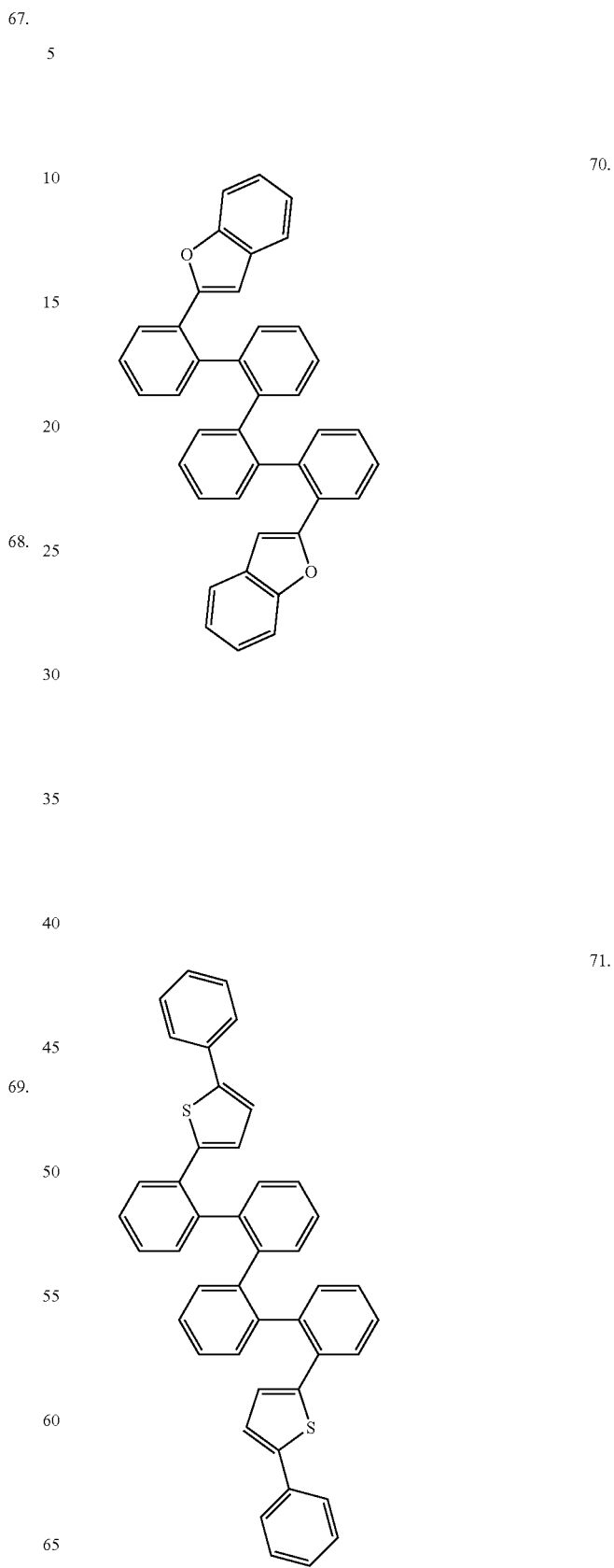

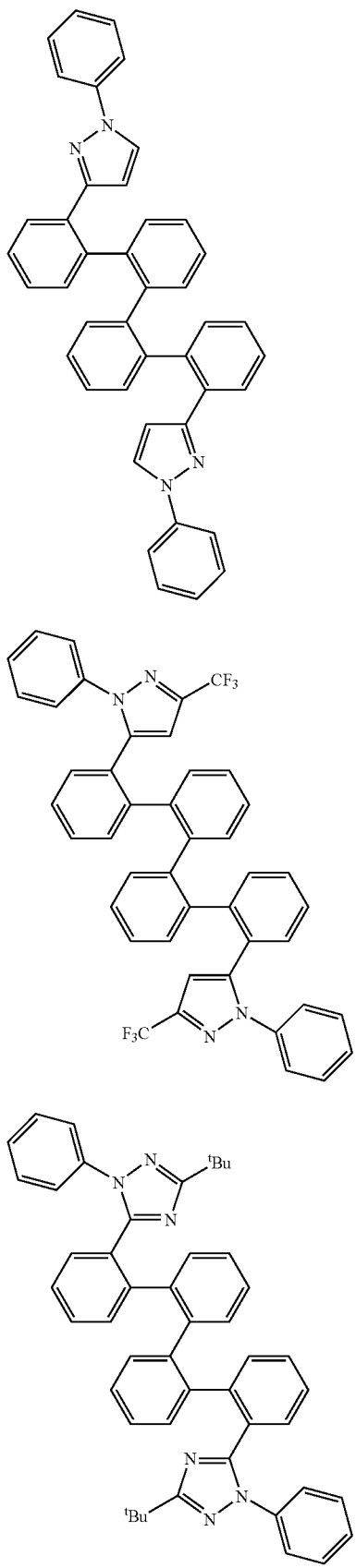
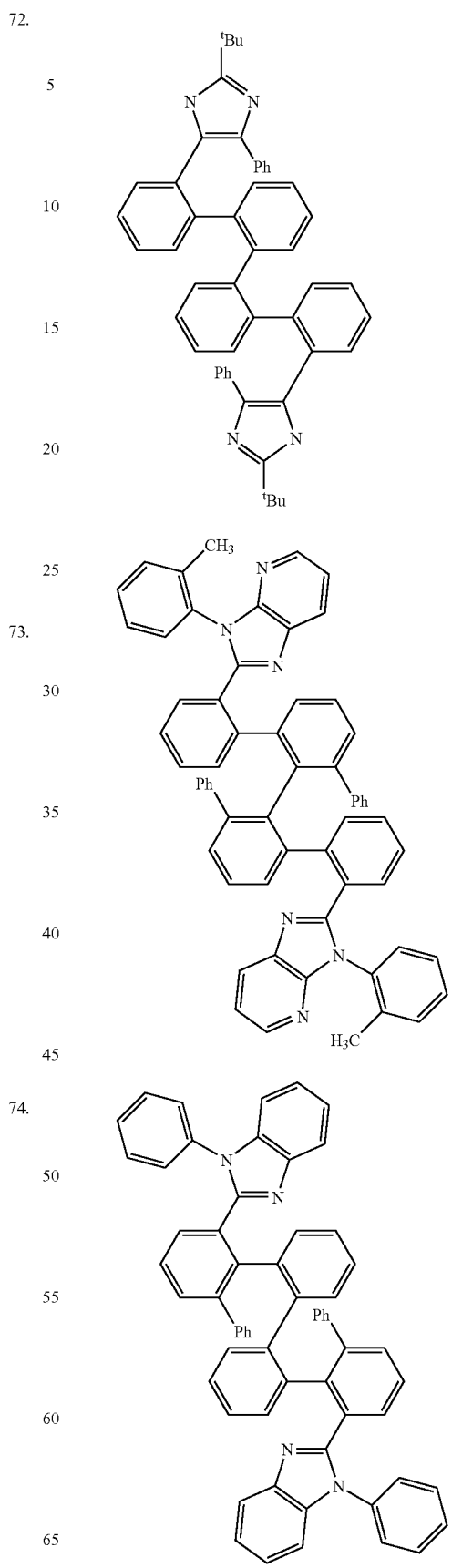

78.
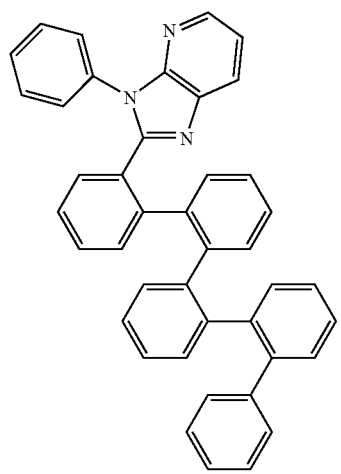
79.
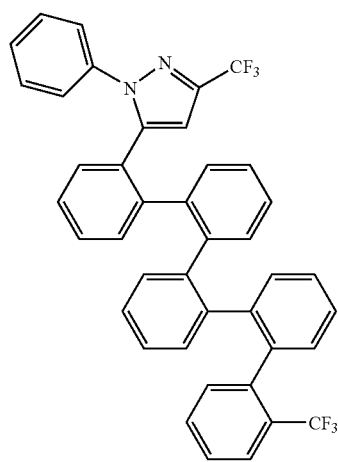
80.
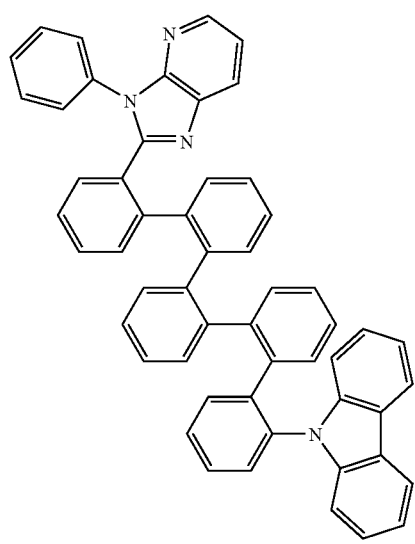
81.
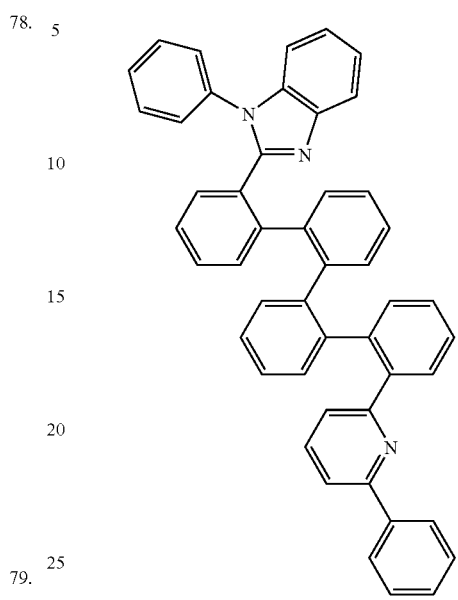
82.
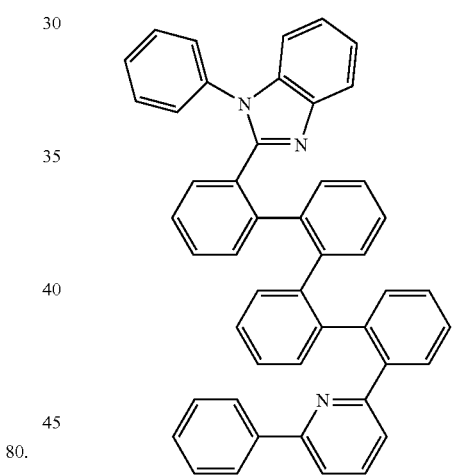
83.
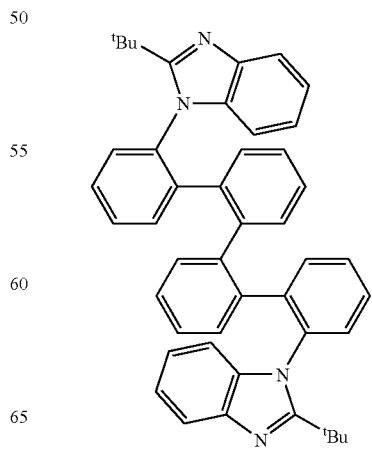

84.
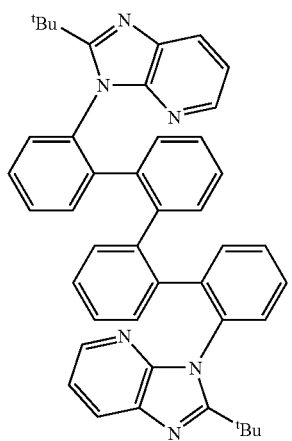
85.
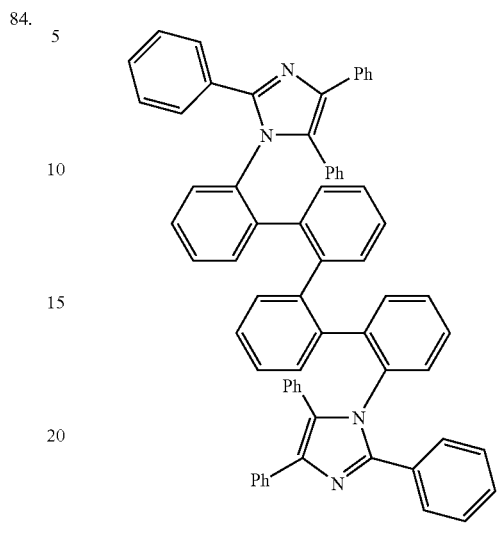
86.
87.
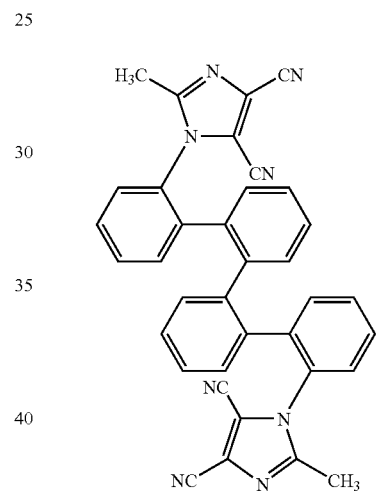
88.
89.
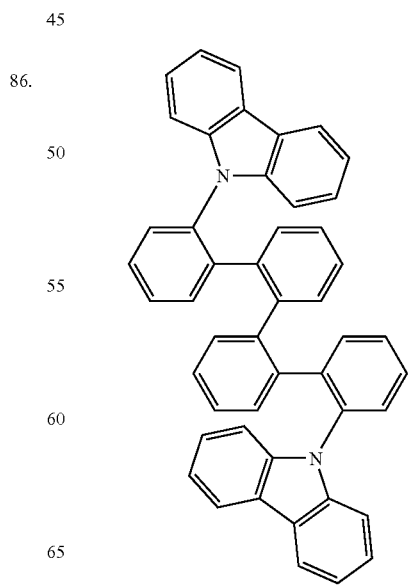

90. 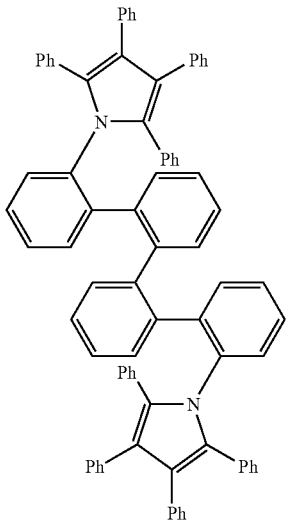
91. 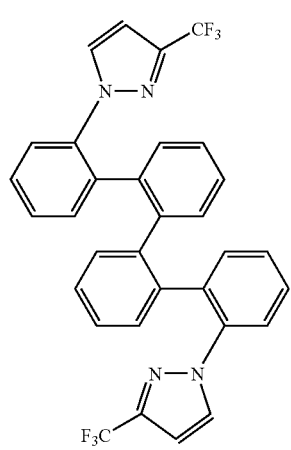
92. 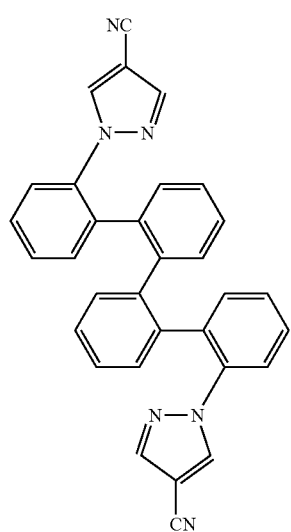
93. 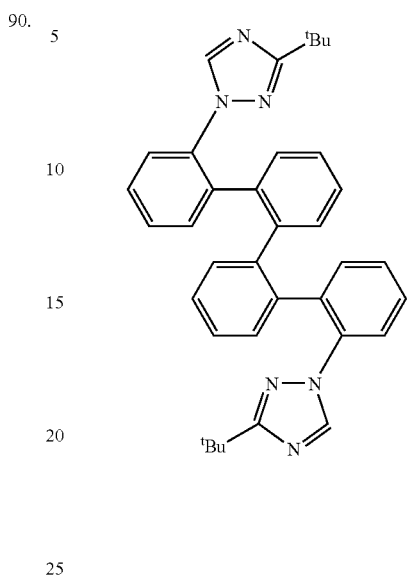
94. 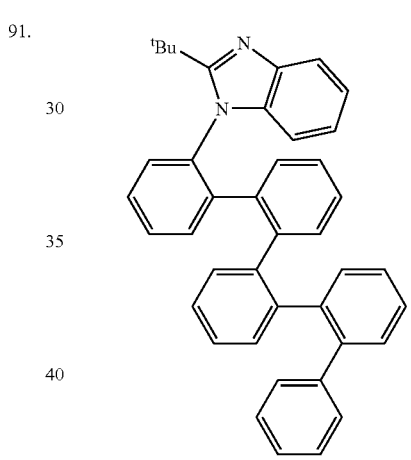
95. 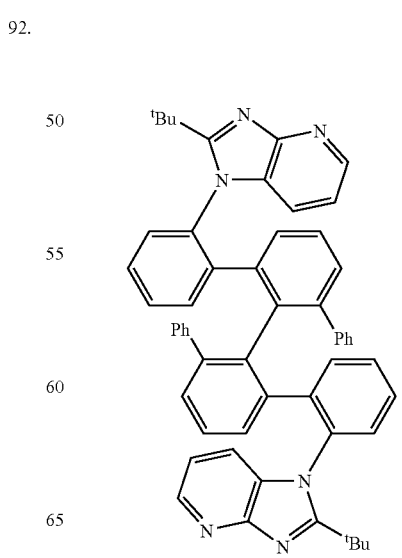

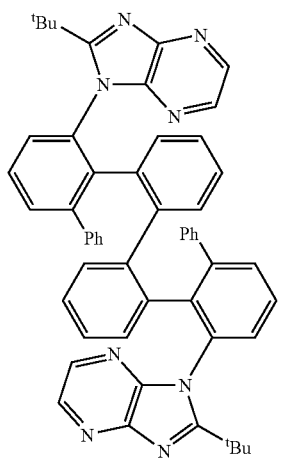

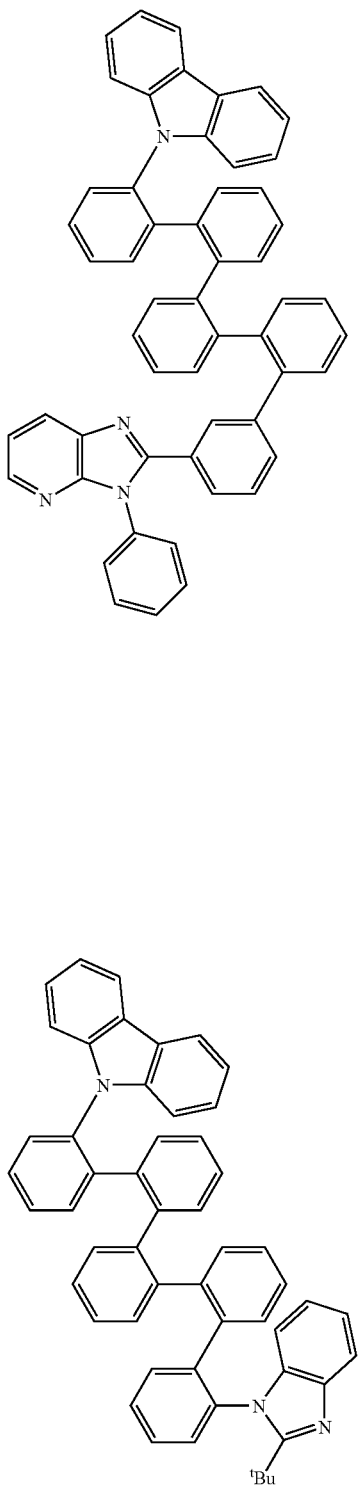
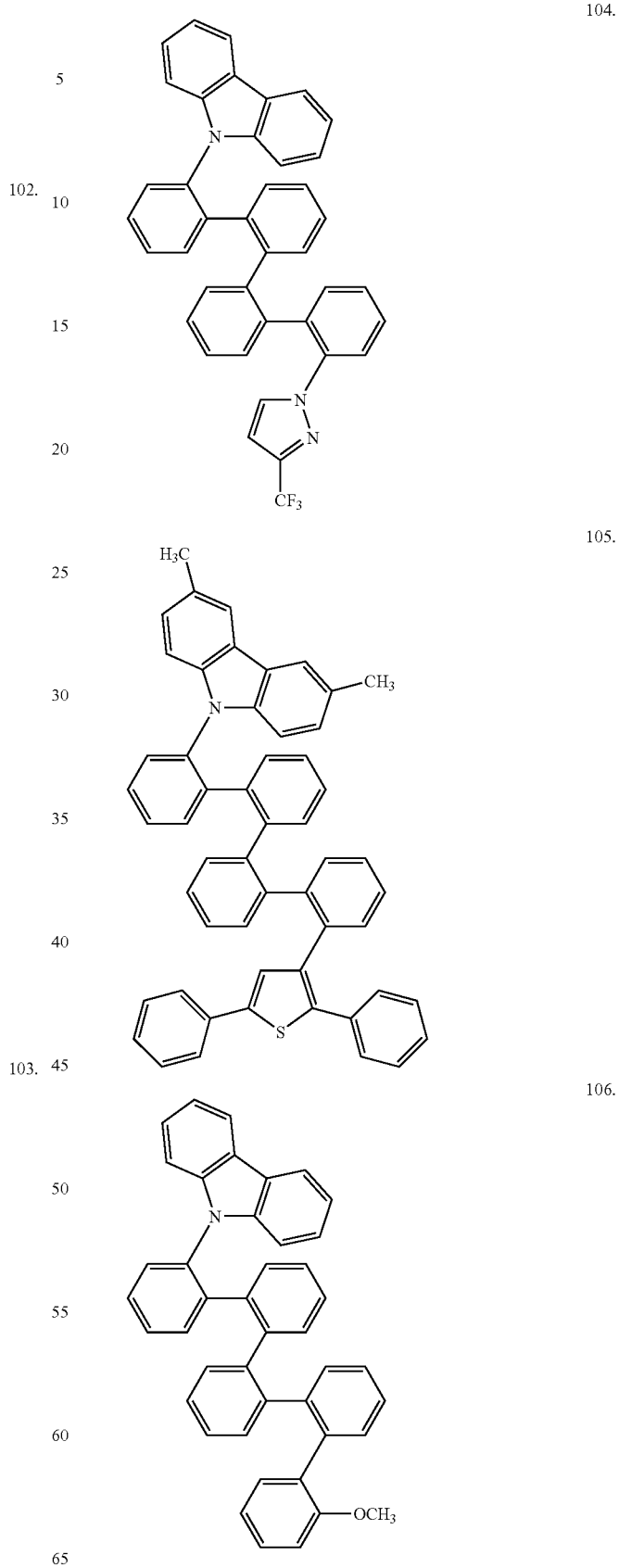

107.
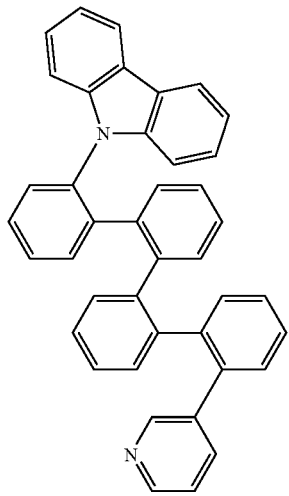
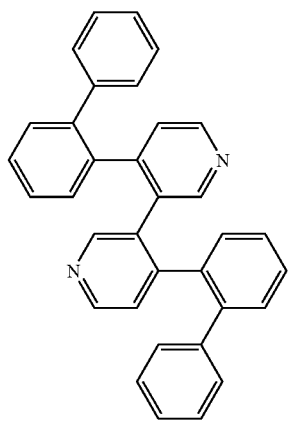
108.
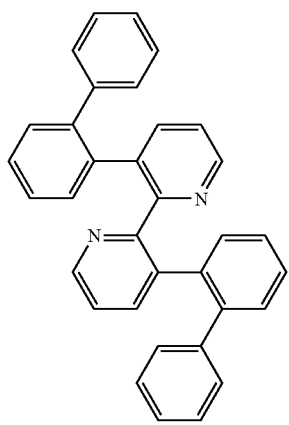
111.
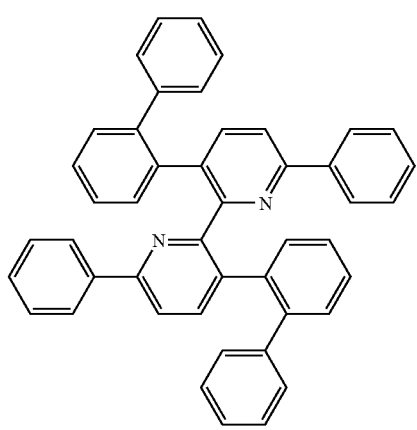
109.
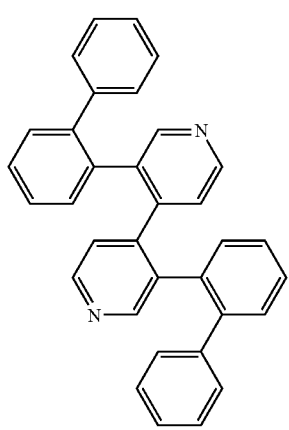
112.
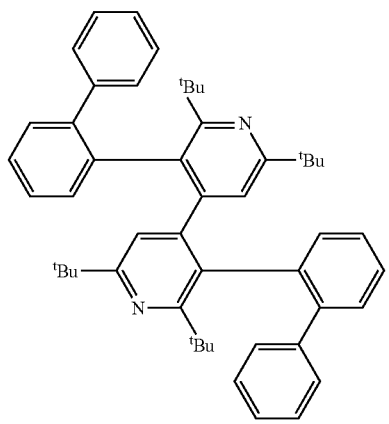

113. 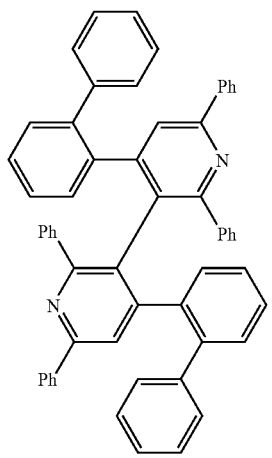
114. 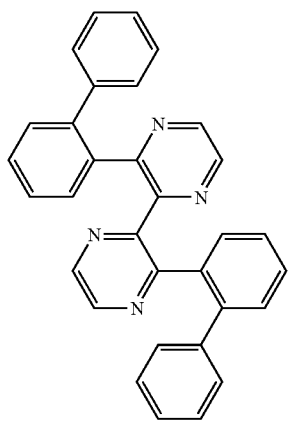
115. 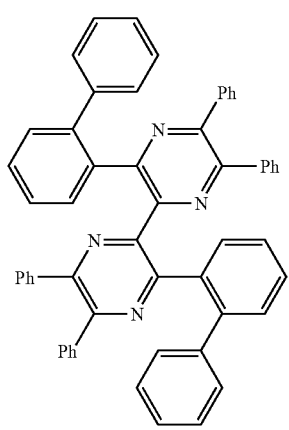
116. 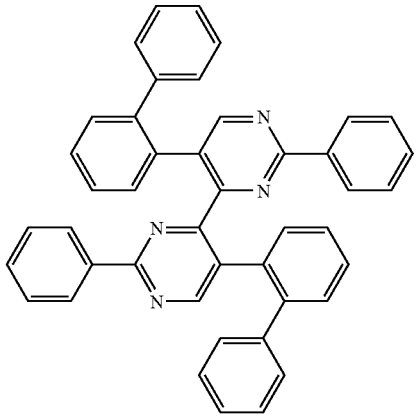
117. 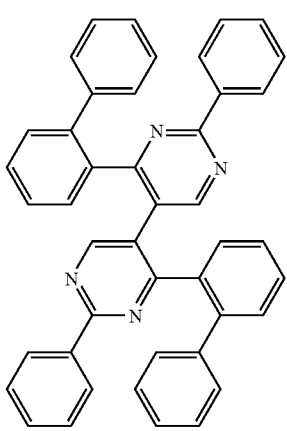
118. 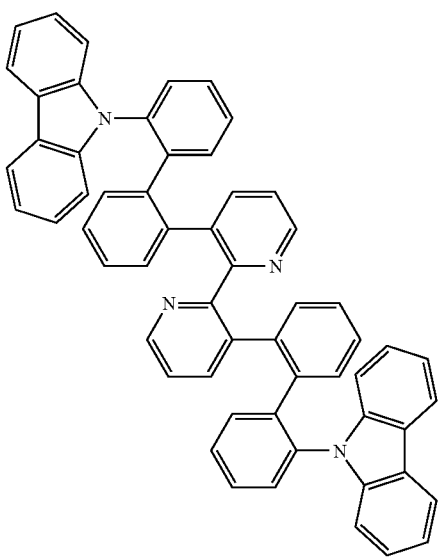

119.
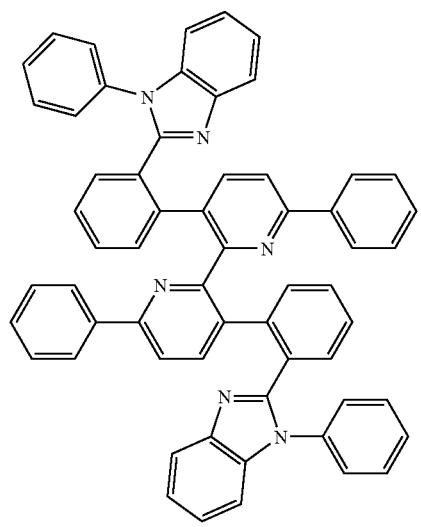
120.
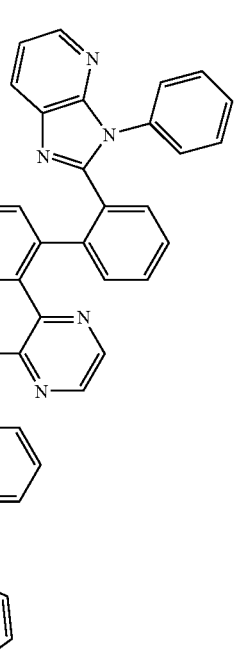
121.
122.
123.
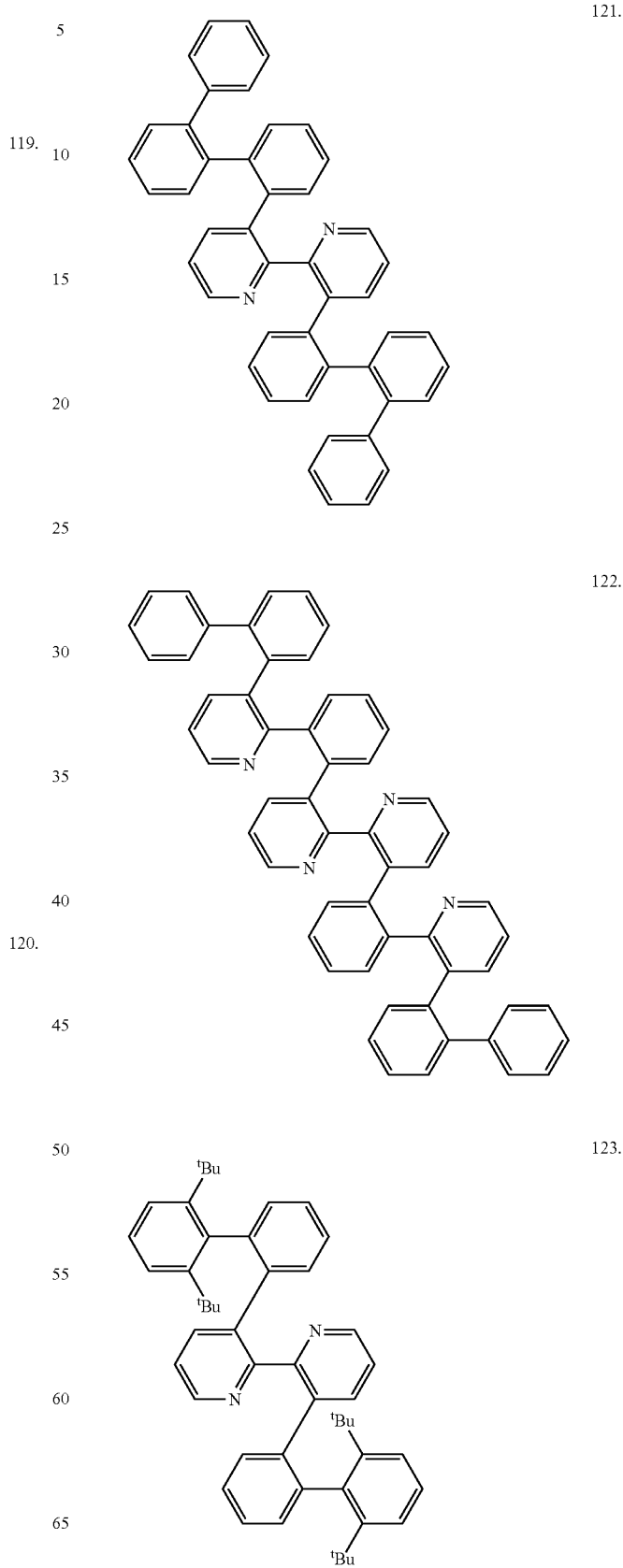

124.
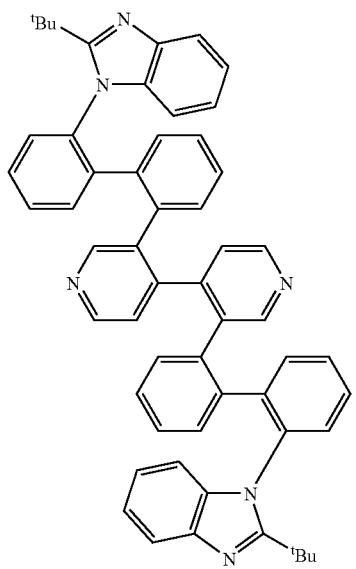
125.
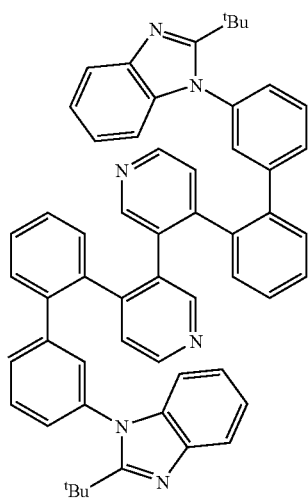
126.
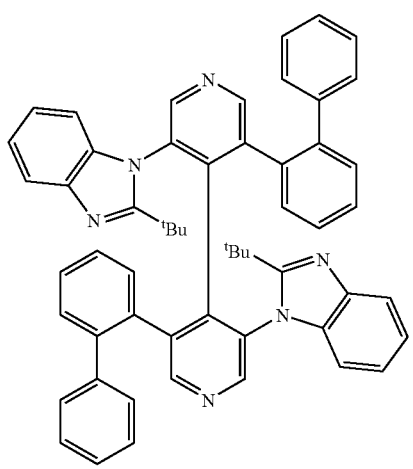
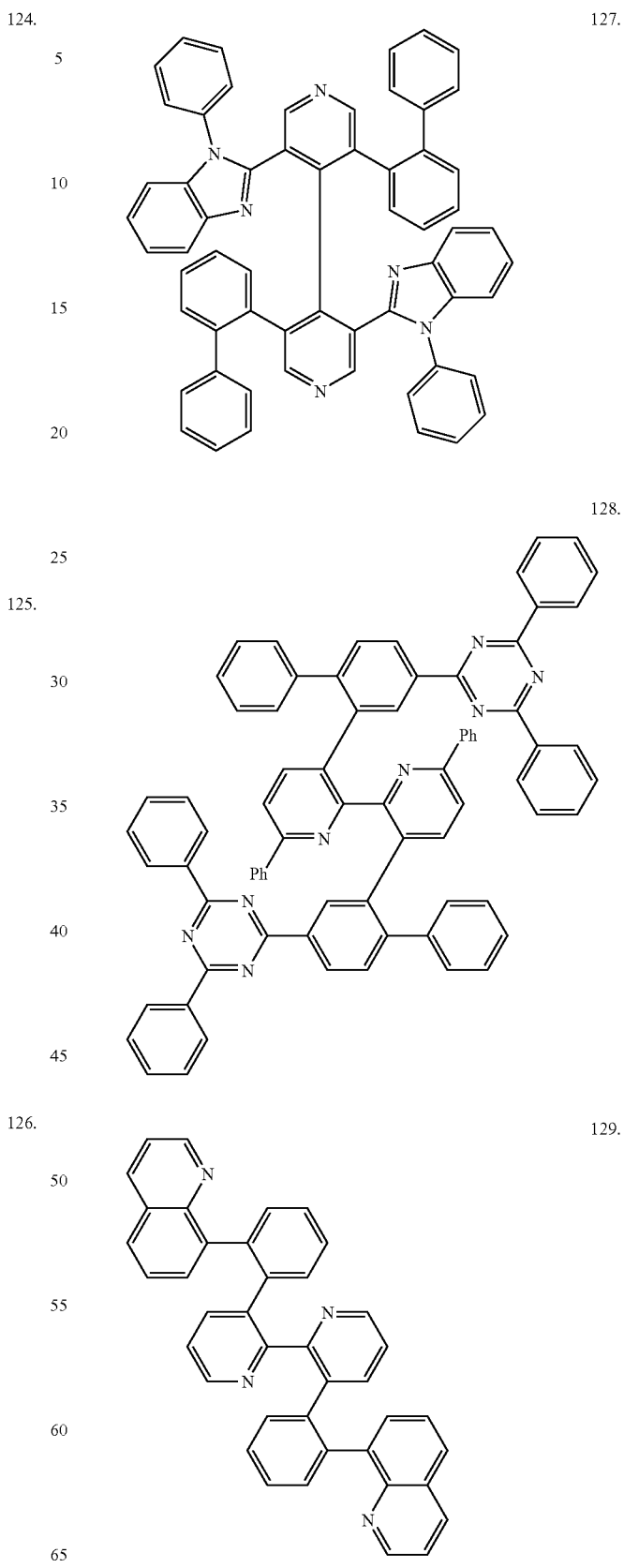

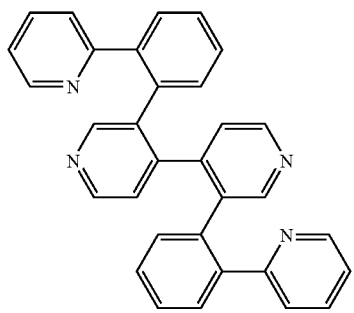
130.
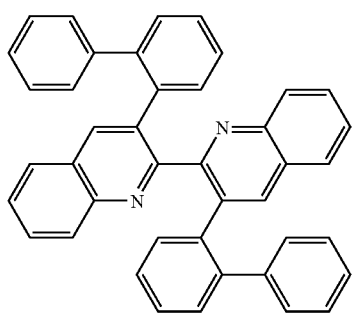
131.
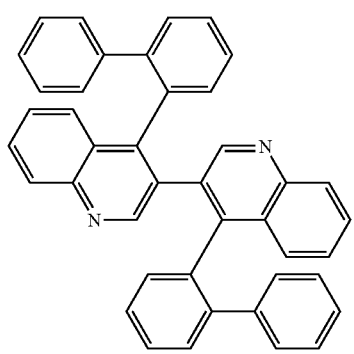
132.
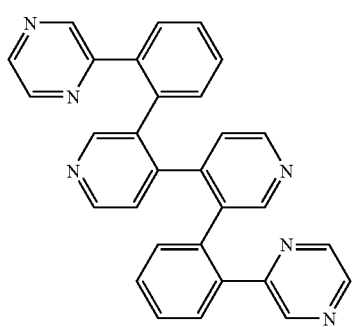
133.
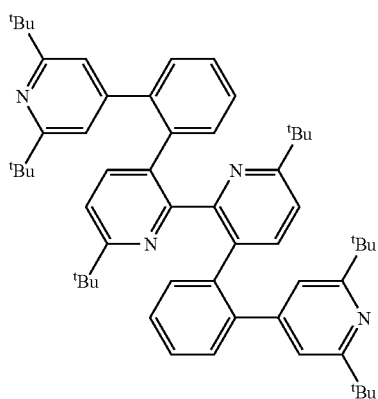
134.
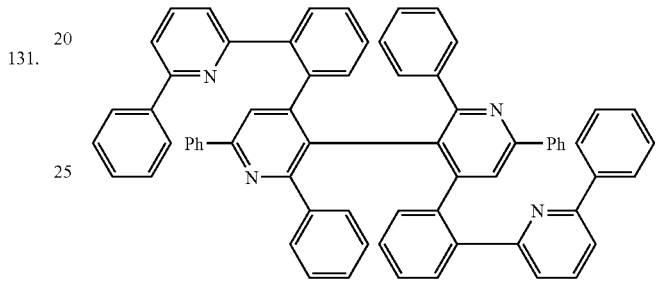
136.
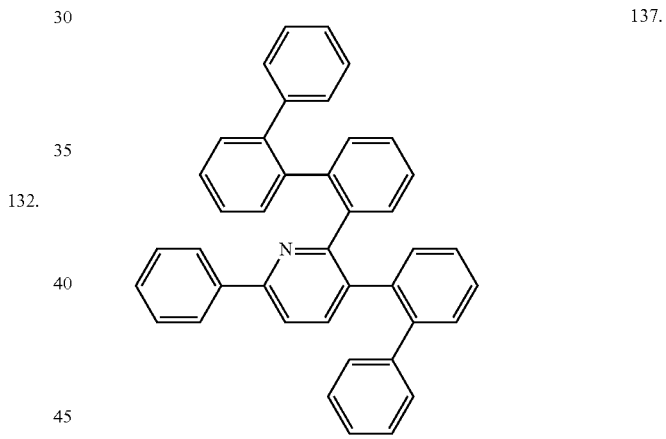
137.
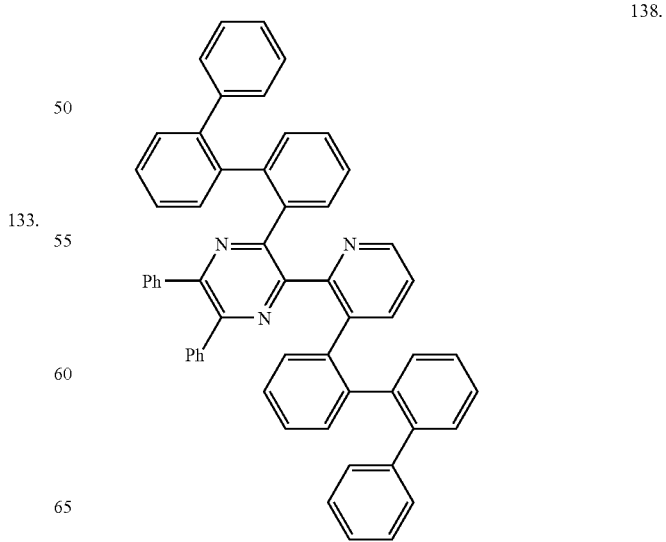
138.

139.
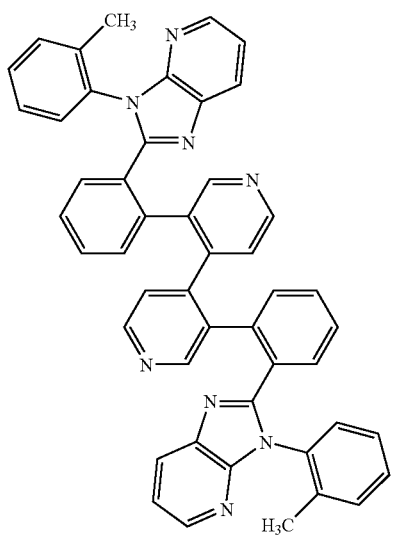
140.
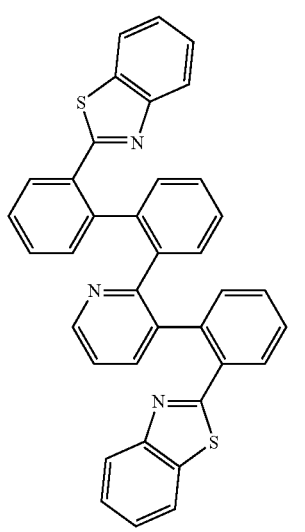
141.
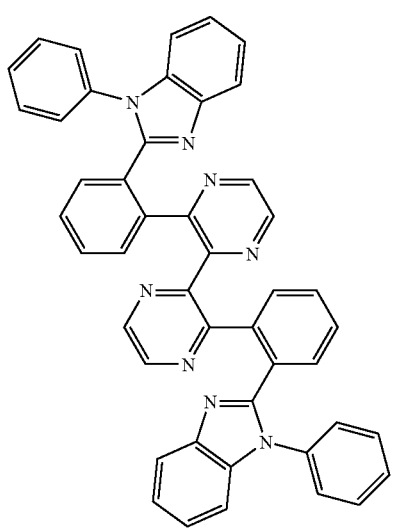
142.
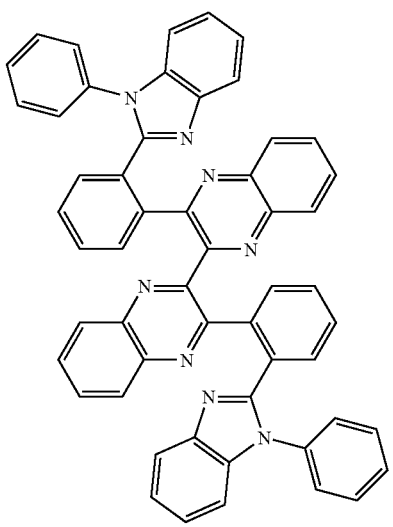
143.
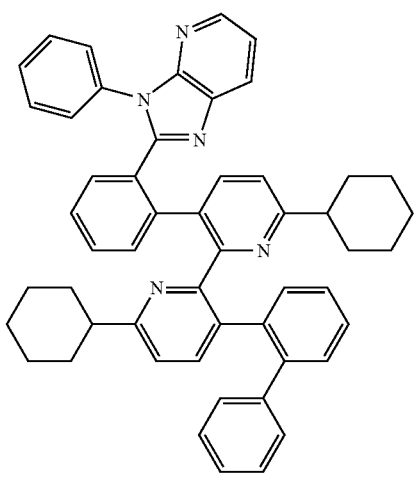
144.
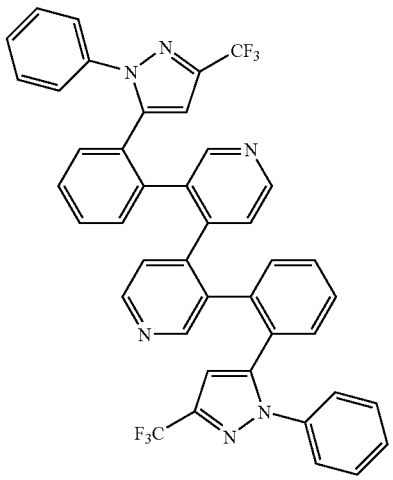

145.
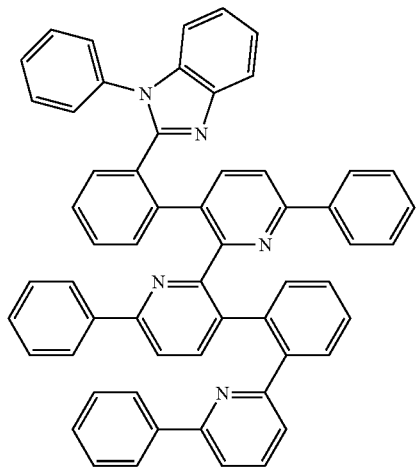
146.
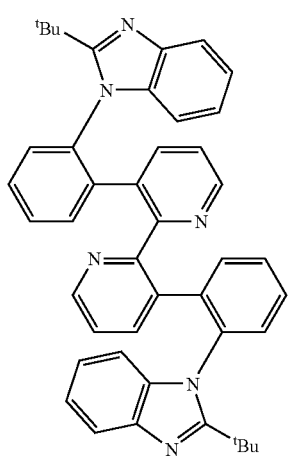
147.
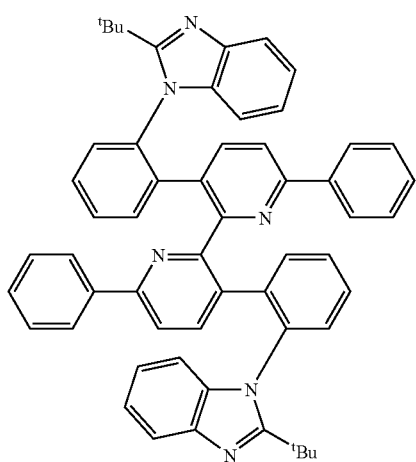
148.
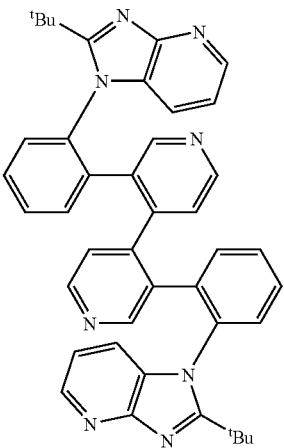
149.
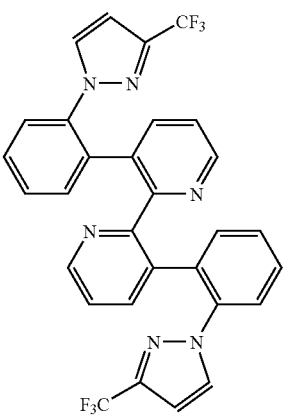
150.
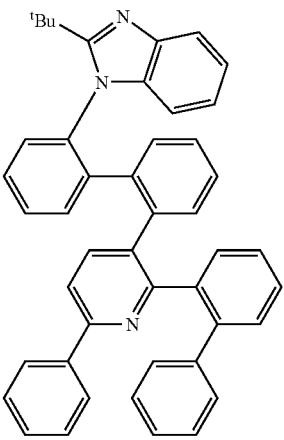
151.
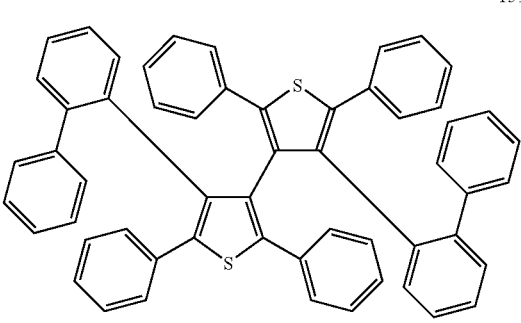

152.
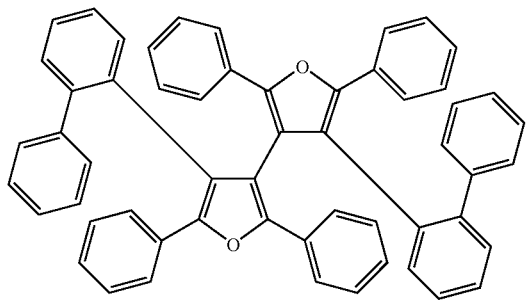
153.
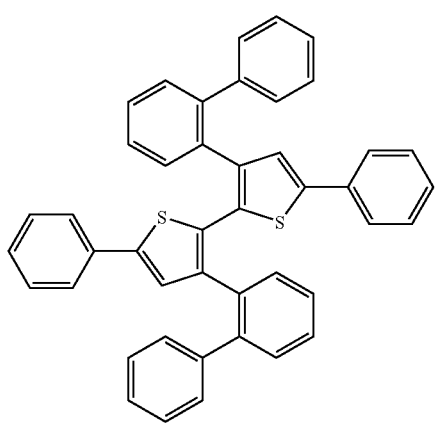
154.
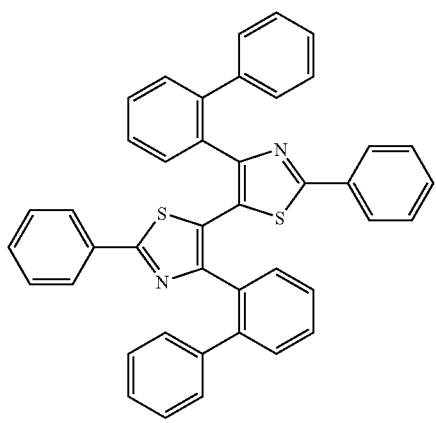
155.
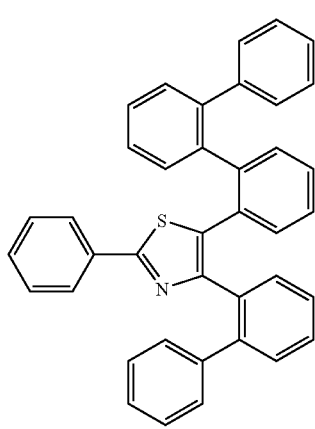
156.
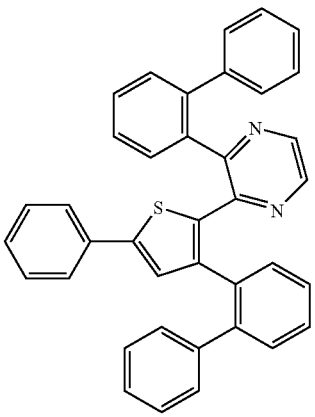
157.
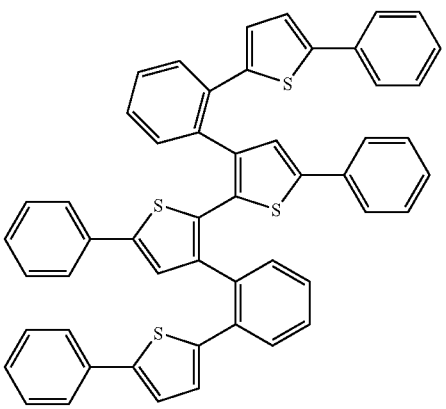
158.
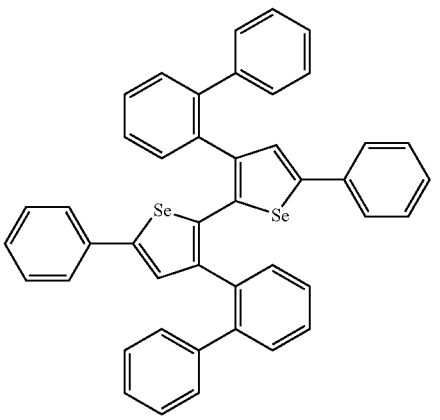

159.
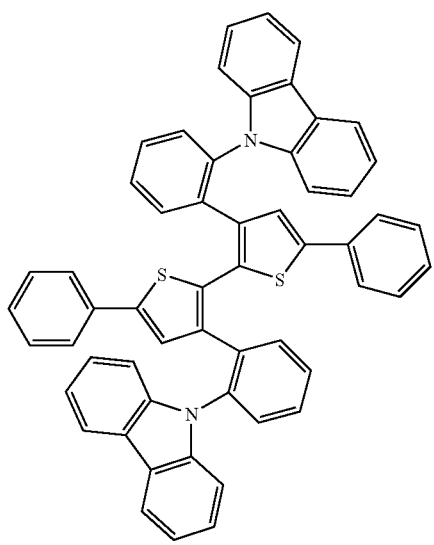
160.
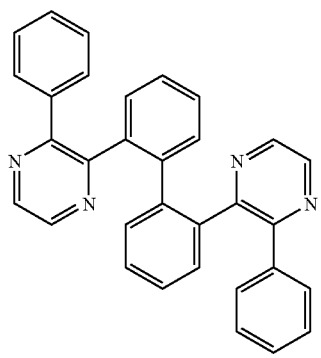
161.
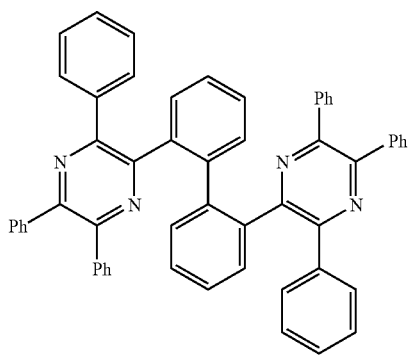
162.
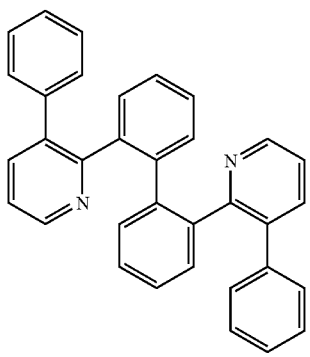
163.
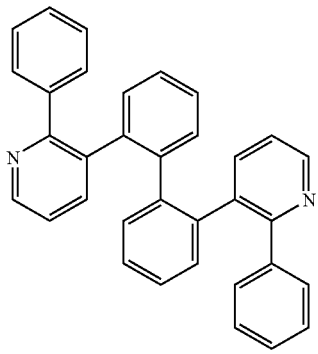
164.
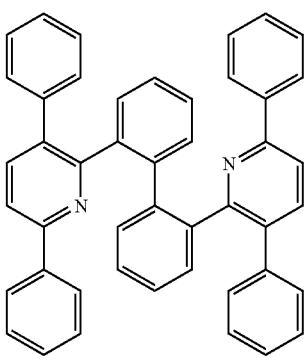
165.
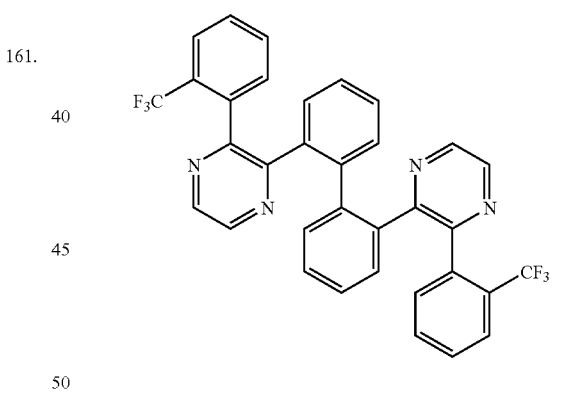
166.
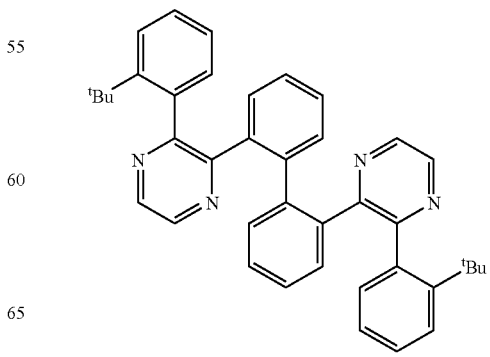

167. 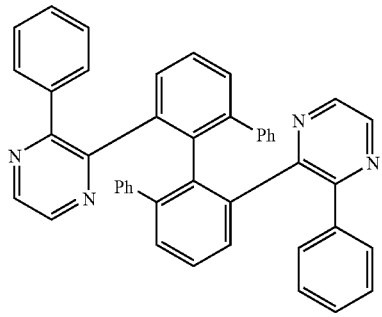
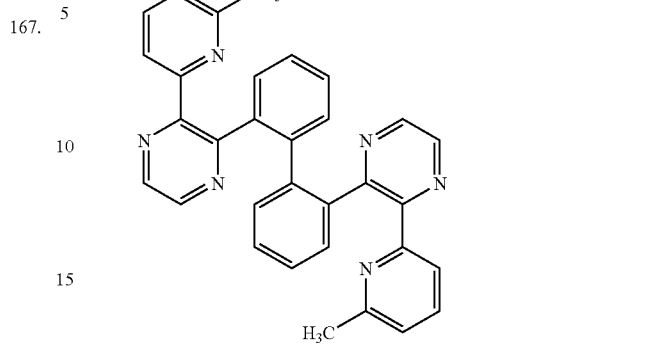 171.
168. 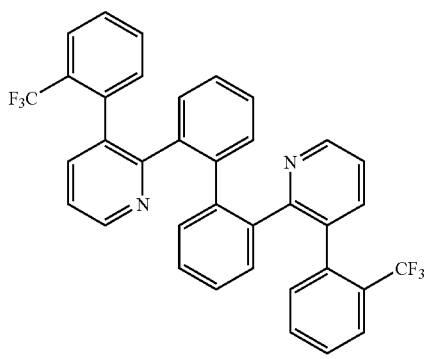
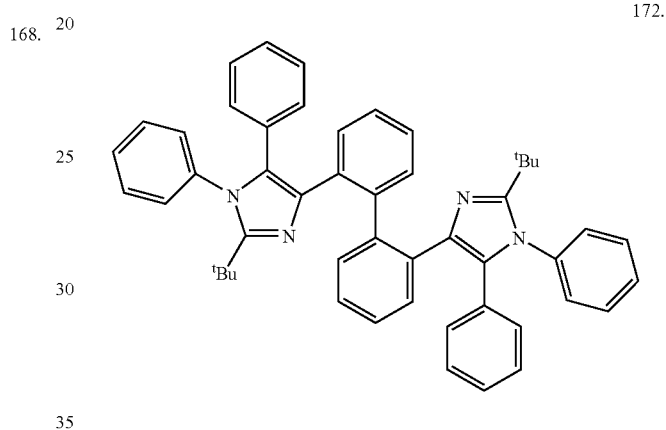 172.
169. 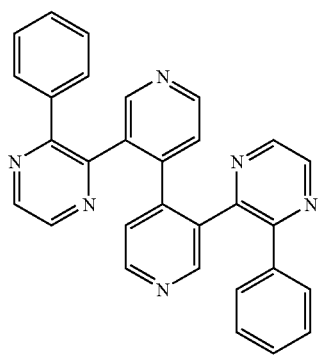
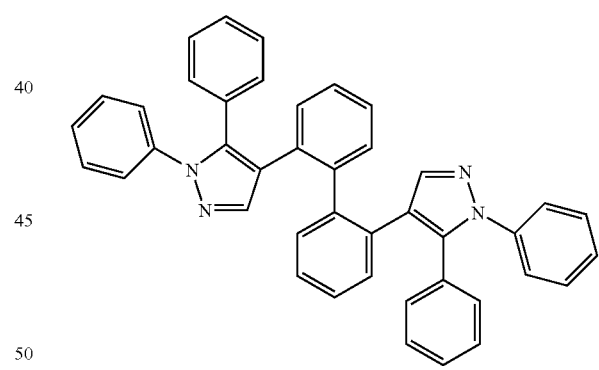 173.
170. 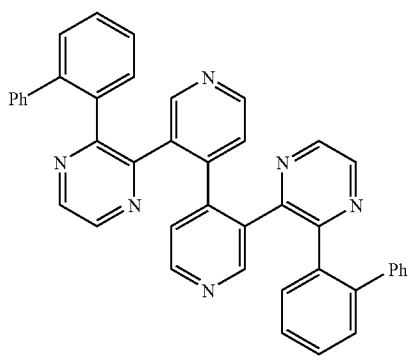
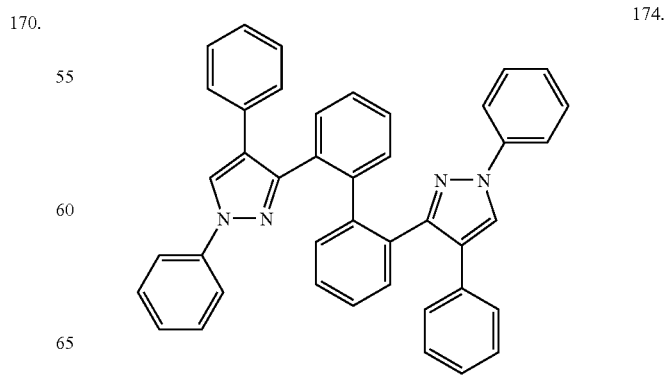 174.

175.
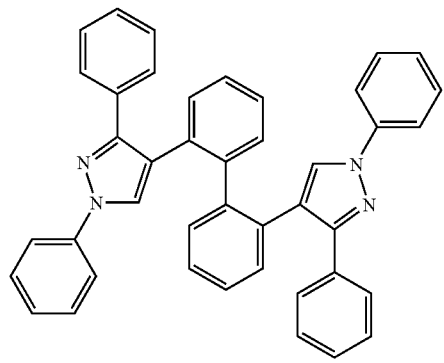
176.
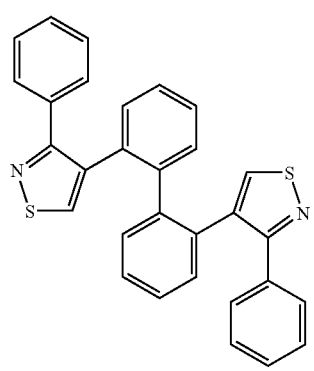
177.
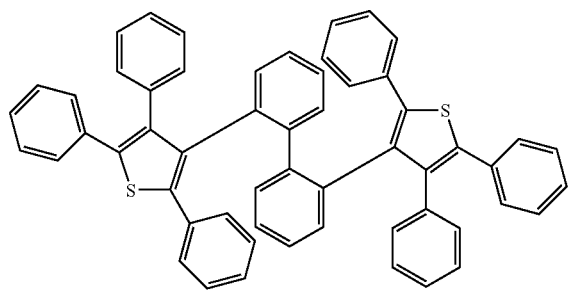
178.
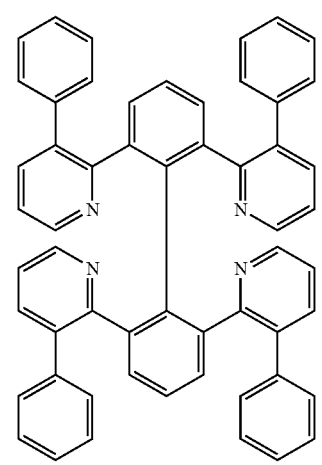
179.
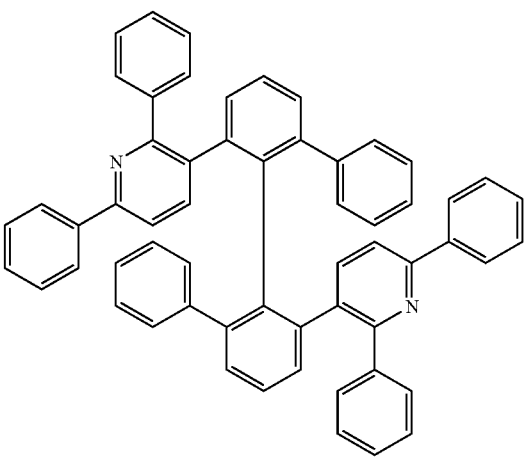
180.
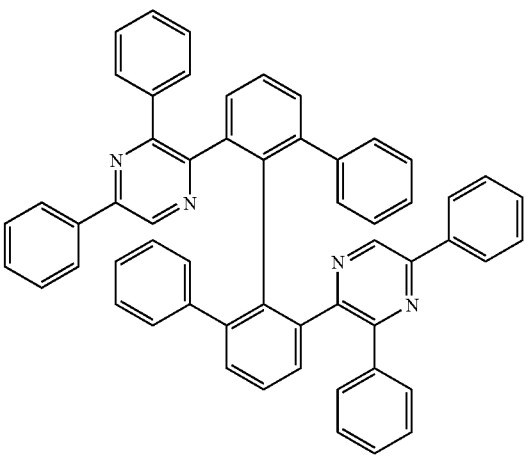
181.
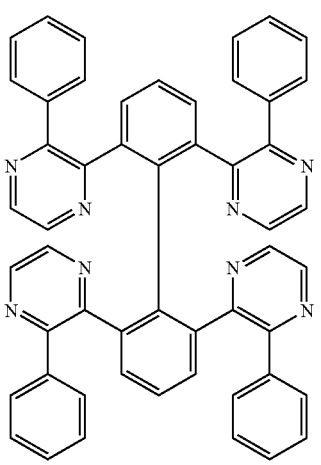

182.

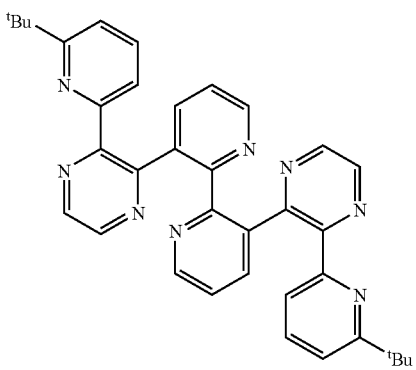

183.

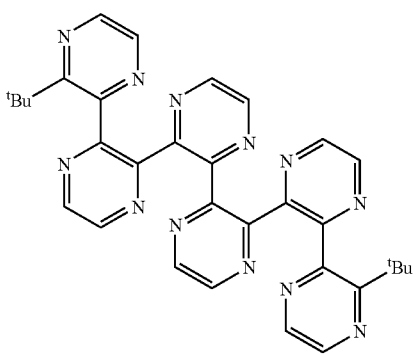

The compounds of the present invention represented by formulae (1) to (5) can be synthesized by the methods described, for example, in Journal of the Chemical Society, Abstracts, 114-21 (January 1964) and Bulletin of the Chemical Society of Japan, 48(6), 1868-74 (1975) or by a combination of other known synthesis methods.

The synthesis method of the compound of the present invention is described below by referring to specific examples.

SYNTHESIS EXAMPLE 1

Synthesis of Compound 1

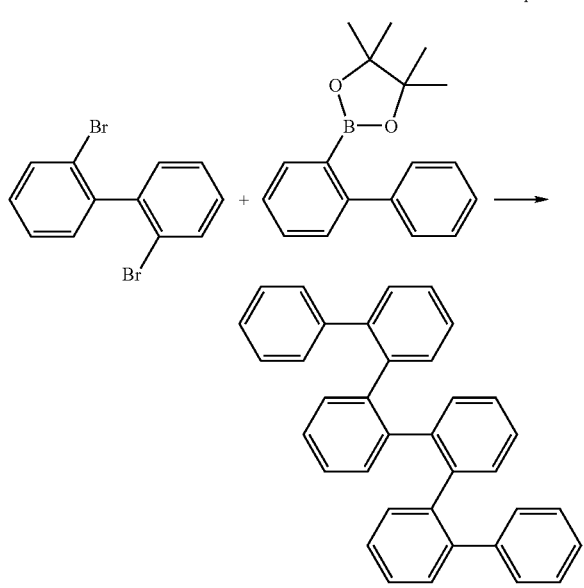

In a nitrogen atmosphere, 1 g (3.21 mmol) of 2,2-dibromobiphenyl, 1.27 g (6.41 mmol) of 2-(4,4,5,5-tetramethyl-1,3,2-dioxaboran-2-yl)biphenyl, 168 mg (0.64 mmol) of triphenylphosphine, 2.39 g (17.3 mmol) of potassium carbonate, 36 mg (0.16 mmol) of palladium acetate, 20 mL of 1,2-dimethoxyethane and 30 mL of water were refluxed under heating for 2 hours. The obtained reaction mixture was extracted with ethyl acetate, and the organic layer was washed with saturated brine and dried over anhydrous magnesium sulfate. After removing the solvent by distillation under reduced pressure, recrystallization from an ethanol-chloroform mixed solvent was performed to obtain 0.70 g (yield: 48%) Compound 1 as a colorless cubic crystal.

SYNTHESIS EXAMPLE 2

Synthesis of Compound 165

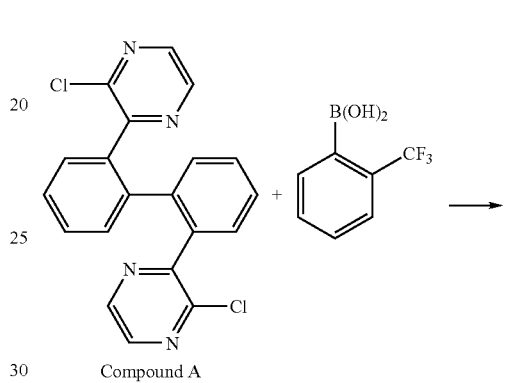

Compound A

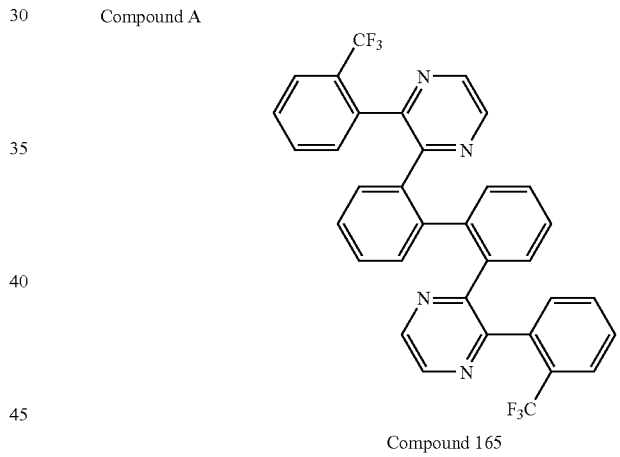

Compound 165

In a nitrogen atmosphere, 1.5 g (3.96 mmol) of Compound A, 3.0 g (15.82 mmol) of o-trifluoromethylphenylboric acid, 207 mg (0.79 mmol) of triphenylphosphine, 2.95 g (21.4 mmol) of potassium carbonate, 44 mg (0.20 mmol) of palladium acetate, 15 mL of 1,2-dimethoxyethane and 20 mL of water were refluxed under heating for 5 hours. The obtained reaction mixture was extracted with ethyl acetate, and the organic layer was washed with saturated brine and dried over anhydrous magnesium sulfate. After removing the solvent by distillation under reduced pressure, recrystallization from chloroform was performed to obtain 2.2 g (yield: 92%) Compound 165 as a colorless powder crystal.

Considering the durability of the device, the glass transition temperature (Tg) of the compound of the present invention is preferably from 130 to 450° C., more preferably from 135 to 450° C., still more preferably from 140 to 450° C., yet still more preferably from 150 to 450° C., and most preferably from 160 to 450° C.

Here, Tg can be confirmed, for example, by the thermal measurement such as differential scanning calorimetry (DSC) and differential thermal analysis (DTA) or by the X-ray diffraction (XRD) or polarizing microscope observation.

In the case where the light-emitting device of the present invention is a light-emitting device utilizing phosphorescence, the lowest excited triplet energy level ($T_1$ level) is preferably from 63 kcal/mol (263.97 kJ/mol) to 95 kcal/mol (398.05 kJ/mol), more preferably from 67 kcal/mol (280.73 kJ/mol) to 95 kcal/mol (398.05 kJ/mol), still more preferably from 69 kcal/mol (289.11 kJ/mol) to 95 kcal/mol (398.05 kJ/mol).

Here, the $T_1$ level can be obtained by measuring a phosphorescent spectrum of a material thin film and determining the level from the short wavelength end.

The elements constituting the light-emitting device of the present invention are described in detail below.

<Substrate>

The substrate for use in the present invention is preferably a substrate which does not scatter or attenuate the light emitted from the organic compound layer. Specific examples thereof include an inorganic material such as zirconia stabilized with yttrium (YSZ) and glass, and an organic material such as polyester (e.g., polyethylene terephthalate, polybutylene phthalate, polyethylene naphthalate), polystyrene, polycarbonate, polyethersulfone, polyallylate, polyimide, polycycloolefin, norbornene resin and poly(chlorotrifluoroethylene).

For example, in the case of using glass as the substrate, the construction material used therefor is preferably non-alkali glass so as to reduce the ion dissolved out from the glass. Also, in the case of using soda lime glass, a barrier coat such as silica is preferably applied thereto before use. In the case of an organic material, those excellent in the heat resistance, dimensional stability, solvent resistance, electrical insulation and processability are preferred.

The shape, structure, size and the like of the substrate are not particularly limited and may be appropriately selected, for example, according to the usage or purpose of the light-emitting device. In general, the substrate shape is preferably a plate form. The substrate structure may be a single-layer structure or a multilayer structure and may be formed of a single member or two or more members.

The substrate may be colorless and transparent or may be colored and transparent but from the standpoint that the light emitted from the organic light-emitting layer is free from scattering, attenuation or the like, the substrate is preferably colorless and transparent.

A moisture permeation-preventing layer (gas barrier layer) may be provided on the front surface or back surface of. the substrate.

As for the material of the moisture permeation-preventing layer (gas barrier layer), an inorganic substance such as silicon nitride and silicon oxide is suitably used. The moisture permeation-preventing layer (gas barrier layer) can be formed by, for example, a high-frequency sputtering method.

In the case of using a thermoplastic substrate, a hardcoat layer, an undercoat layer and the like may be further provided, if desired.

<Anode>

The anode is usually sufficient if it has a function as an electrode of supplying a hole to the organic compound layer. The shape, structure, size and the like thereof are not particularly limited, and the anode material may be appropriately selected from known electrode materials according to the usage or purpose of the light-emitting device. As described above, the anode is usually provided as a transparent anode.

Suitable examples of the material for the anode include a metal, an alloy, a metal oxide, an electrically conducting compound and a mixture thereof. Specific examples of the anode material include an electrically conducting metal oxide such as tin oxide doped with antimony, fluorine or the like (ATO, FTO), tin oxide, zinc oxide, indium oxide, indium tin oxide (ITO) and indium zinc oxide (IZO); a metal such as gold, silver, chromium and nickel; a mixture or laminate of the metal and the electrically conducting metal oxide; an inorganic electrically conducting substance such as copper iodide and copper sulfide; an organic electrically conducting material such as polyaniline, polythiophene and polypyrrole; and a laminate of such a material and ITO. Among these, an electrically conducting metal oxide is preferred, and ITO is more preferred in view of productivity, high electrical conductivity, transparency and the like.

The anode can be formed on the substrate by a method appropriately selected, in consideration of suitability for the material constituting the anode, from a wet system such as printing and coating, a physical system such as vacuum deposition, sputtering and ion plating, and a chemical system such as CVD and plasma CVD. For example, in the case of selecting ITO as the anode material, the anode may be formed by a DC or high-frequency sputtering method, a vacuum deposition method or an ion plating method.

In the organic electroluminescent device of the present invention, the position where the anode is formed is not particularly limited and may be appropriately selected according to the usage or purpose of the light-emitting device, but the anode is preferably formed on the substrate. In this case, the anode may be formed entirely or partially on one surface of the substrate.

The patterning when forming the anode may be performed by chemical etching such as photolithography, by physical etching using a laser or the like, by vacuum deposition or sputtering using a mask, or by a lift-off method or printing method.

The thickness of the anode may be appropriately selected according to the material constituting the anode and cannot be indiscriminately specified but is usually on the order of 10 nm to 50 μm, preferably from 50 nm to 20 μm.

The resistance value of the anode is preferably $10^3$ Ω/square or less, more preferably $10^2$ Ω/square or less. In the case where the anode is transparent, the anode may be colorless and transparent or may be colored and transparent. In order to take out light from the transparent anode side, the transmittance of the anode is preferably 60% or more, more preferably 70% or more.

Incidentally, the transparent anode is described in detail in Yutaka Sawada (supervisor), Tomei Denkyoku Maku no Shin-Tenkai (New Development of Transparent Electrode Film, CMC (1999), and the matters described therein can be applied in the present invention. In the case of employing a plastic substrate having low heat resistance, a transparent anode film-formed using ITO or IZO at a low temperature of 150° C. or less is preferred.

<Cathode>

The cathode is usually sufficient if it has a function as an electrode of injecting an electron in the organic compound layer. The shape, structure, size and the like thereof are not particularly limited, and the cathode material may be appropriately selected from known electrode materials according to the usage or purpose of the light-emitting device.

Examples of the material constituting the cathode include a metal, an alloy, a metal oxide, an electrically conducting compound and a mixture thereof. Specific examples thereof include an alkali metal (e.g., Li, Na, K, Cs), an alkaline earth metal (e.g., Mg, Ca), gold, silver, lead, aluminum, a sodium-potassium alloy, a lithium-aluminum alloy, a magnesium-silver alloy, and a rare earth metal such as indium and ytterbium. One species of these materials may be used alone, but in view of satisfying both stability and electron-injecting property, two or more species may be suitably used in combination.

Among these materials constituting the cathode, an alkali metal and an alkaline earth metal are preferred in view of electron-injecting property, and a material mainly comprising aluminum is preferred in view of excellent storage stability.

The "material mainly comprising aluminum" indicates aluminum alone or an alloy or mixture of aluminum with 0.01 to 10 mass % of an alkali metal or alkaline earth metal (for example, a lithium-aluminum alloy and a magnesium-aluminum alloy).

Incidentally, the cathode material is described in detail in JP-A-2-15595 and JP-A-5-121172, and the materials described therein can be applied also in the present invention.

The method for forming the cathode is not particularly limited, and the cathode may be formed according to known methods. For example, the cathode may be formed by a method appropriately selected, in consideration of suitability for the material constituting the cathode, from a wet system such as printing and coating, a physical system such as vacuum deposition, sputtering and ion plating, and a chemical system such as CVD and plasma CVD. For example, in the case of selecting a metal or the like as the cathode material, one species or two or more species thereof may be sputtered simultaneously or sequentially.

The patterning when forming the cathode may be performed by chemical etching such as photolithography, by physical etching using a laser or the like, by vacuum deposition or sputtering using a mask, or by a lift-off method or printing method.

In the present invention, the position where the cathode is formed is not particularly limited, and the cathode may be formed entirely or partially on the organic compound layer.

A dielectric layer comprising a fluoride, oxide or the like of an alkali metal or alkaline earth metal may be inserted between the cathode and the organic compound layer to have a thickness of 0.1 to 5 nm. This dielectric layer may be regarded as a kind of electron injection layer. The dielectric layer can be formed, for example, by a vacuum vapor deposition method, a sputtering method or an ion plating method.

The thickness of the cathode may be appropriately selected according to the material constituting the cathode and cannot be indiscriminately specified but is usually on the order of 10 nm to 5 μm, preferably from 50 nm to 1 μm.

The cathode may be transparent or opaque. The transparent cathode may be formed by film-forming the cathode material to a small thickness of 1 to 10 nm and further stacking thereon a transparent electrically conducting material such as ITO and IZO.

<Organic Compound Layer>

The organic compound layer for use in the present invention is described below.

The organic electroluminescent device of the present invention has at least one organic compound layer including a light-emitting layer, and the organic compound layer other than the light-emitting layer includes, as described above, layers such as hole transport layer, electron transport layer, charge blocking layer, hole injection layer and electron injection layer.

—Formation of Organic Compound Layer—

In the organic electroluminescent device of the present invention, the layers constituting the organic compound layer each may be suitably formed by any method such as dry film-forming method (e.g., vapor deposition, sputtering), transfer method and printing method.

—Organic Light-Emitting Layer—

The organic light-emitting layer is a layer having a function of, when an electric field is applied, receiving a hole from the anode, hole injection layer or hole transport layer, receiving an electron from the cathode, electron injection layer or electron transport layer, and providing a site for recombination of a-hole and an electron, thereby emitting light.

In the present invention, the light-emitting layer may be composed of only a light-emitting material or may have a mixed layer structure of a host material and a light-emitting material. The light-emitting material may be either a fluorescent material or a phosphorescent material and as for the dopant, one species or two or more species may be used. The host material is preferably a charge transport material. As for the host material, one species or two or more species may be used, and examples thereof include a construction where an electron-transporting host material and a hole-transporting host material are mixed. Also, the light-emitting layer may contain a material which does not have electron transport property and does not emit light.

Furthermore, the light-emitting layer may be composed of one layer or two or more layers, and the layers may differ in the color of light emitted.

Examples of the fluorescent material which can be used in the present invention include a benzoxazole derivative, a benzimidazole derivative, a benzothiazole derivative, a styrylbenzene derivative, a polyphenyl derivative, a diphenylbutadiene derivative, a tetraphenylbutadiene derivative, a naphthalimide derivative, a coumarin derivative, a condensed aromatic compound, a perynone derivative, an oxadiazole derivative, an oxazine derivative, an aldazine derivative, a pyralidine derivative, a cyclopentadiene derivative, a bis-styrylanthracene derivative, a quinacridone derivative, a pyrrolopyridine derivative, a thiadiazolopyridine derivative, a cyclopentadiene derivative, a styrylamine derivative, a diketopyrrolopyrrole derivative, an aromatic dimethylidine compound, various metal complexes as represented by a metal complex of 8-quinolinol derivative and a metal complex of pyrromethene derivative, a polymer compound such as polythiophene, polyphenylene and polyphenylenevinylene, and a compound such as organic silane derivative.

Examples of the phosphorescent material which can be used in the present invention include a complex containing a transition metal atom or a lanthanoid atom.

The transition metal atom is not particularly limited, but preferred examples thereof include ruthenium, rhodium, palladium, tungsten, rhenium, osmium, iridium and platinum, with rhenium, iridium and platinum being more preferred.

Examples of the lanthanoid atom include lanthanum, cerium, praseodymium, neodymium, samarium, europium, gadolinium, terbium, dysprosium, holmium, erbium, thulium, ytterbium and lutetium. Among these lanthanoid atoms, neodymium, europium and gadolinium are preferred.

Examples of the ligand of the complex include the ligands described in G. Wilkinson et al., Comprehensive Coordination Chemistry, Pergamon Press (1987), H. Yersin, Photochemistry and Photophysics of Coordination Compounds, Springer-Verlag (1987), and Akio Yamamoto, Yuki Kinzoku Kagaku—Kiso to Oyo—(Metalorganic Chemistry—Foundation and Application—), Shokabo (1982).

Specifically, the ligand is preferably a halogen ligand (preferably chlorine ligand), a nitrogen-containing heterocyclic ligand (e.g., phenylpyridine, benzoquinoline, quinolinol, bipyridyl, phenanthroline), a diketone ligand (e.g., acetylacetone), a carboxylic acid ligand (e.g., acetic acid ligand), a carbon monoxide ligand, an isonitrile ligand or a cyano ligand, more preferably a nitrogen-containing heterocyclic ligand is more preferred. The complex may have one transition metal atom in the compound or may be a so-called dinuclear complex having two or more transition metal atoms. Different kinds of metal atoms may be contained at the same time.

The phosphorescent material is preferably an iridium complex or a platinum complex, more preferably a tetradentate platinum complex or an iridium complex having a fluorine-substituted phenylpyridine as a ligand.

The phosphorescent material is preferably contained in the light-emitting layer in an amount of 0.1 to 40 mass %, more preferably from 0.5 to 20 mass %.

Examples of the host material contained in the light-emitting layer of the present invention include, other than the compound of the present invention, the materials having a carbazole skeleton, a diarylamine skeleton, a pyridine skeleton, a pyrazine skeleton, a triazine skeleton or an arylsilane skeleton, and the materials described later in the paragraphs of hole injection layer, hole transport layer, electron injection layer and electron transport layer.

The thickness of the light-emitting layer is not particularly limited but usually, the thickness is preferably from 1 to 500 nm, more preferably from 5 to 200 nm, still more preferably from 10 to 100 nm.

—Hole Injection Layer, Hole Transport Layer—

The hole injection layer and hole transport layer are a layer having a function of receiving a hole from the anode or anode side and transporting it to the cathode side. Specifically, the hole injection layer and hole transport layer each is preferably a layer containing, other than the compound of the present invention, a carbazole derivative, a triazole derivative, an oxazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidyne-based compound, a porphyrin-based compound, an organic silane compound, carbon or the like.

The thickness of each of the hole injection layer and the hole transport layer is preferably 500 nm or less from the standpoint of lowering the driving voltage.

The thickness of the hole transport layer is preferably from 1 to 500 nm, more preferably from 5 to 200 nm, still more preferably from 10 to 100 nm, and the thickness of the hole injection layer is preferably from 0.1 to 200 nm, more preferably from 0.5 to 100 nm, still more preferably from 1 to 100 nm.

The hole injection layer and hole transport layer each may have a single-layer structure comprising one species or two or more species of the above-described materials or may have a multilayer structure comprising a plurality of layers having the same composition or different compositions.

—Electron Injection Layer, Electron Transport Layer—

The electron injection layer and electron transport layer are a layer having a function of receiving an electron from the cathode or cathode side and transporting it to the anode side. Specifically, the electron injection layer and electron transport layer each is preferably a layer containing, other than the compound of the present invention, a triazole derivative, an oxazole derivative, an oxadiazole derivative, an imidazole derivative, a fluorenone derivative, an anthraquinodimethane derivative, an anthrone derivative, a diphenylquinone derivative, a thiopyran dioxide derivative, a carbodiimide derivative, a fluorenylidenemethane derivative, a distyrylpyrazine derivative, an aromatic ring tetracarboxylic acid anhydride such as naphthalene and perylene, a phthalocyanine derivative, various metal complexes as represented by a metal complex of 8-quinolinol derivative and a metal complex having metal phthalocyanine, benzoxazole or benzothiazole as a ligand, an organic silane derivative or the like.

The thickness of each of the electron injection layer and the electron transport layer is preferably 500 nm or less from the standpoint of lowering the driving voltage.

The thickness of the electron transport layer is preferably from 1 to 500 nm, more preferably from 5 to 200 nm, still more preferably from 10 to 100 nm, and the thickness of the electron injection layer is preferably from 0.1 to 200 nm, more preferably from 0.2 to 100 nm, still more preferably from 0.5 to 50 nm.

The electron injection layer and electron transport layer each may have a single-layer structure comprising one species or two or more species of the above-described materials or may have a multilayer structure comprising a plurality of layers having the same composition or different compositions.

—Hole Blocking Layer—

The hole blocking layer is a layer having a function of preventing the hole transported from the anode side to the light-emitting layer, from penetrating to the cathode side.

Examples of the organic compound constituting the hole blocking layer include, other than the compound of the present invention, an aluminum complex such as BAlq, a triazole derivative, and a phenanthroline derivative such as BCP.

The thickness of the hole blocking layer is preferably from 1 to 500 nm, more preferably from 5 to 200 nm, still more preferably from 10 to 100 nm.

The hole blocking layer may have a single-layer structure comprising one species or two or more species of the above-described materials or may have a multilayer structure comprising a plurality of layers having the same composition or different compositions.

<Protective Layer>

In the present invention, the entire organic EL device may be protected by a protective layer.

The material contained in the protective layer may be sufficient if it has a function of preventing a device deterioration promoter such as moisture and oxygen from intruding into the device.

Specific examples thereof include a metal such as In, Sn, Pb, Au, Cu, Ag, Al, Ti and Ni, a metal oxide such as MgO, SiO, $SiO_2$, $Al_2O_3$, GeO, NiO, CaO, BaO, $Fe_2O_3$, $Y_2O_3$ and $TiO_2$, a metal nitride such as $SiN_x$ and $SiN_xO_y$, a metal fluoride such as $MgF_2$, LiF, $AlF_3$ and $CaF_2$, polyethylene, polypropylene, polymethyl methacrylate, polyimide, polyurea, polytetrafluoroethylene, polychlorotrifluoroethylene, polydichlorodifluoroethylene, a copolymer of chlorotrifluoroethylene and dichlorodifluoroethylene, a copolymer obtained by copolymerizing a monomer mixture containing tetrafluoroethylene and at least one comonomer, a fluorine-containing copolymer having a cyclic structure in the copolymer main chain, a water-absorbing substance having a water absorption percentage of 1% or more, and a moisture-proof substance having a water absorption percentage of 0.1% or less.

The method for forming the protective layer is not particularly limited, and examples of the method which can be applied include a vacuum deposition method, a sputtering method, a reactive sputtering method, an MBE method, a cluster ion beam method, an ion plating method, a plasma polymerization method (high-frequency excitation ion plating method), a plasma CVD method, a laser CVD method, a thermal CVD method, a gas source CVD method, a coating method, a printing method and a transfer method.

<Encapsulation>

The organic electroluminescent device of the present invention may be subjected to encapsulation of the entire device by using a sealing container.

Also, a moisture absorbent or an inactive liquid may be enclosed in the space between the sealing container and the light-emitting device. The moisture absorbent is not particularly limited but examples thereof include barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieve, zeolite and magnesium oxide. The inactive liquid is not particularly limited but examples thereof include paraffins, liquid paraffins, a fluorine-based solvent such as perfluoroalkane, perfluoroamine and perfluoroether, a chlorine-based solvent and silicone oils.

In the organic electroluminescent device of the present invention, a DC (if desired, may contain an AC component) voltage (usually from 2 to 15 V) or a DC current is applied between the anode and the cathode, whereby light emission can be obtained.

As for the driving method of the organic electroluminescent device of the present invention, the driving methods described, for example, in JP-A-2-148687, JP-A-6-301355, JP-A-5-29080, JP-A-7-134558, JP-A-8-234685, JP-A-8-241047, Japanese Patent 2,784,615, and U.S. Pat. Nos. 5,828,429 and 6,023,308 may be applied.

EXAMPLES

Comparative Example 1

A 0.5 mm-thick and 2.5 cm-square glass substrate with an ITO film (produced by GEOMATEC Company Limited, surface resistance: 10 Ω/square) was placed in a cleaning vessel and after ultrasonic cleaning in 2-propanol, treated with UV-ozone for 30 minutes. On this transparent anode (ITO film), the following organic compound layers were sequentially vapor-deposited by a vacuum deposition method.

Unless otherwise indicated, the vapor deposition speed in Examples of the present invention is 0.2 nm/sec. The vapor deposition speed was measured by using a crystal oscillator. In the following, the film thickness is also a value measured by using a crystal oscillator.
(First Hole Transport Layer)
  Copper phthalocyanine: film thickness of 10 nm.
(Second Hole Transport Layer)
  NPD: film thickness of 40 nm.
(Light-Emitting Layer)
  [CBP (90 mass %)+Firpic] layer: film thickness of 30 nm.
(First Electron Transport Layer)
  BAlq: film thickness of 10 nm.
(Second Electron Transport Layer)
  Alq: film thickness of 10 nm.

Finally, lithium fluoride of 0.1 nm and metallic aluminum of 100 nm were vapor-deposited in this order to form a cathode.

The resulting structure was placed in a glove box replaced with an argon gas, while keeping it away from contact with air, and encapsulated by using a stainless steel-made sealing can and an ultraviolet-curable adhesive (XNR5516HV, produced by Nagase-Ciba) to obtain an organic electroluminescent device of Comparative Example 1.

Comparative Example 2

An organic electroluminescent device of Comparative Example 2 was produced in the same manner as the organic electroluminescent device of <Comparative Example 1> except for changing CBP to Compound (XVI) (a compound described in JP-A-2002-356449).

Chemical structures of copper phthalocyanine, NPD, CBP, Firpic, Alq, BAlq and Compound (XVI) are shown below.

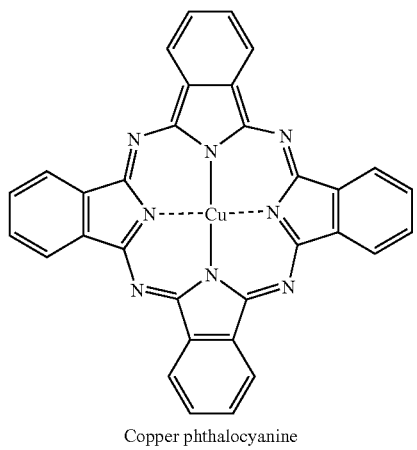

Copper phthalocyanine

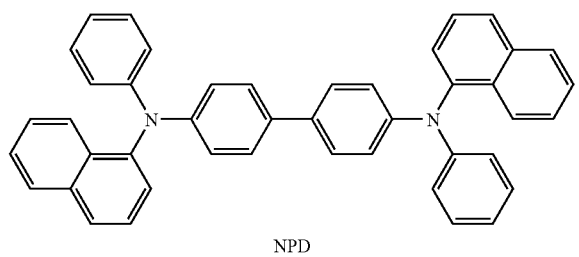

NPD

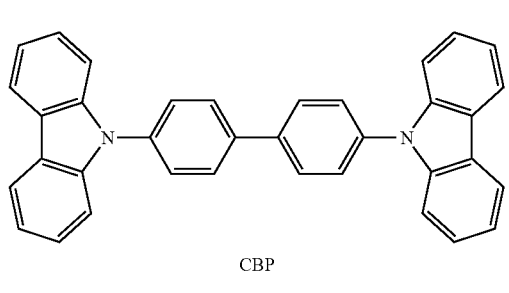

CBP

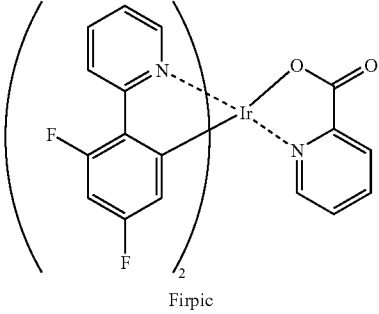

Firpic

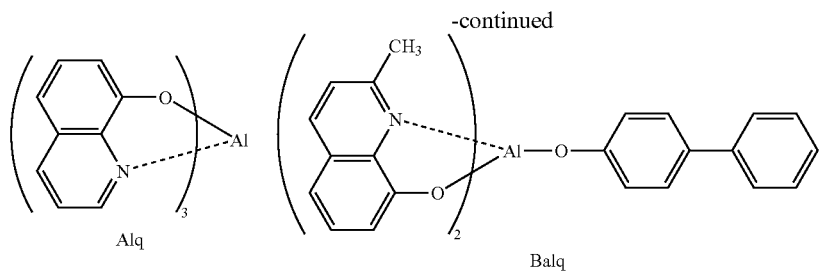

Alq

Balq

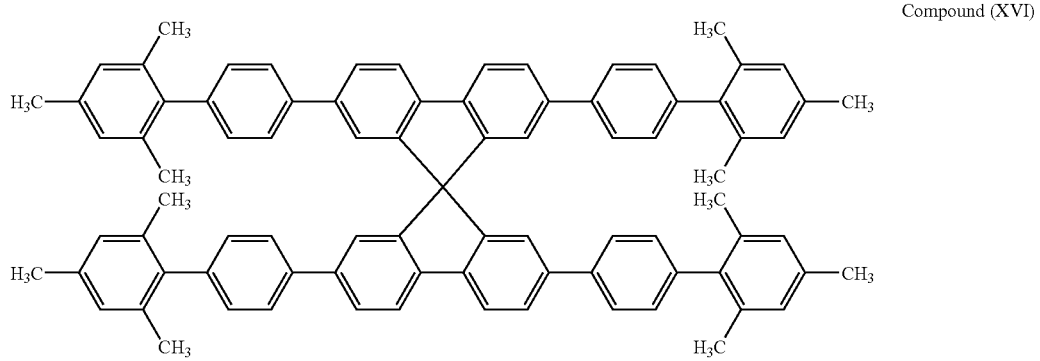

Compound (XVI)

Example 1

An organic electroluminescent device of Example 1 was produced in the same manner as the organic electroluminescent device of <Comparative Example 1> except for changing CBP to Compound 10 of the present invention.

Example 2

An organic electroluminescent device of Example 2 was produced in the same manner as the organic electroluminescent device of <Comparative Example 1> except for changing CBP to Compound 48 of the present invention.

Example 3

An organic electroluminescent device of Example 3 was produced in the same manner as the organic electroluminescent device of <Comparative Example 1> except for changing CBP to Compound 89 of the present invention.

Example 4

An organic electroluminescent device of Example 4 was produced in the same manner as the organic electroluminescent device of <Comparative Example 1> except for changing CBP to Compound 165 of the present invention.

Example 5

An organic electroluminescent device of Example 5 was produced in the same manner as the organic electroluminescent device of <Comparative Example 1> except for changing CBP to Compound 62 of the present invention.

Example 6

An organic electroluminescent device of Example 6 was produced in the same manner as the organic electroluminescent device of <Comparative Example 1> except for changing CBP to Compound 114 of the present invention.

Example 7

An organic electroluminescent device of Example 7 was produced in the same manner as the organic electroluminescent device of <Comparative Example 1> except for changing CBP to Compound 153 of the present invention.

A voltage of 10 V was applied to each of the devices of Examples 1 to 7 and Comparative Examples 1 and 2, as a result, light emission originated from Firpic was obtained in the light-emitting devices of Examples 1 to 7 and Comparative Example 1, but light emission originated from Firpic was not observed in the device of Comparative Example 2.

The relative ratio of brightness when the devices of Examples 1 to 7 and Comparative Example 1 were driven by an applied voltage of 10 V, and the brightness half-life of the devices of Examples 1 to 7 and Comparative Example 1 are shown in Table 1. The brightness half-life was measured as the time $t_{0.5}$ in which the brightness is decreased to 50% of the initial brightness, by setting the device in OLED Test System Model ST-D manufactured by Tokyo Systems Development Co., Ltd. and driving it in a constant current mode under the condition of a forward constant current of 0.4 mA.

TABLE 1

| | Relative Value of Brightness | Brightness Half-Life |
| --- | --- | --- |
| Comparative Example 1 | 1 | 6 minutes |
| Example 1 | 5 | 9 hours |
| Example 2 | 12 | 10 hours |
| Example 3 | 9 | 6 hours |
| Example 4 | 11 | 7 hours |
| Example 5 | 10 | 7 hours |
| Example 6 | 5 | 4 hours |
| Example 7 | 5 | 3 hours |

Example 8

An organic electroluminescent device of Example 8 was produced in the same manner as the organic electroluminescent device of <Comparative Example 1> except for changing BAlq to Compound 160 of the present invention.

The relative ratio of brightness when the devices of Example 8 and Comparative Example 1 were driven by an applied voltage of 10 V was 4:1.

Example 9

An organic electroluminescent device of Example 9 was produced in the same manner as the organic electroluminescent device of <Comparative Example 1> except for changing NPD to Compound 34 of the present invention.

The relative ratio of brightness when the devices of Example 9 and Comparative Example 1 were driven by an applied voltage of 10 V was 5:1.

As verified in Examples above, an organic electroluminescent device with high efficiency and high durability can be obtained by using the compound of the present invention.

The organic electroluminescent device of the present invention is characterized by comprising at least one species of the compounds represented by formula (1) to (5) of the present invention (in the specification, used in the same meaning as the "compound of the present invention"). By virtue of this construction, an organic electroluminescent device (in the present specification, used in the same meaning as the "device of the present invention") assured of high emission efficiency (for example, external quantum efficiency) and excellent durability can be provided. Also, by virtue of using the compound of the present invention having a specific structure, a device capable of emitting light with high emission efficiency in the blue region and assured of excellent durability can be provided.

The entire disclosure of each and every foreign patent application from which the benefit of foreign priority has been claimed in the present application is incorporated herein by reference, as if fully set forth.

What is claimed is:

1. An organic electroluminescent device, which comprises:
    a pair of electrodes; and
    at least one organic compound layer between the pair of electrodes, the at least one organic compound layer comprises at least a light-emitting layer,
    wherein at least one of the at least one organic compound layer comprises at least one compound represented by formula (1):
    Formula (1):

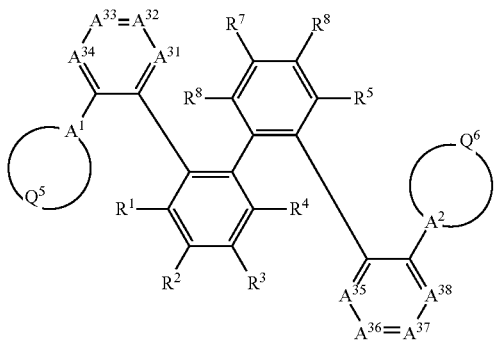

wherein $A^1$ and $A^2$ each independently represents a carbon atom or a nitrogen atom;
    $Q^5$ and $Q^6$ each independently represents an atomic group for forming an aromatic hydrocarbon ring or an aromatic heterocyclic ring in combination with $A^1$ and $A^2$ respectively, provided that $Q^5$ and $Q^6$ are not combined through a single bond, a divalent aromatic hydrocarbon ring group or a divalent aromatic heterocyclic ring group;
    $A^{31}$ to $A^{38}$ each independently represents N or C—$R^{31}$ to C—$R^{38}$;
    $R^{31}$ to $R^{38}$ each independently represents a hydrogen atom or a substituent; and
    $R^1$ to $R^8$ each independently represents a hydrogen atom or a substituent,
    wherein the at least one compound represented by formula (1) has a glass transition temperature of 130 to 450° C., and has the lowest excited triplet energy level of from 63 kcal/mol to 95 kcal/mol.

2. The organic electroluminescent device according to claim 1,
    wherein the light-emitting layer comprises a light-emitting material, and
    wherein the light-emitting material comprises at least a phosphorescent material.

3. The organic electroluminescent device according to claim 2,
    wherein the phosphorescent material is an iridium complex or a platinum complex.

4. The organic electroluminescent device according to claim 2,
    wherein the phosphorescent material is a platinum complex of a tetradentate ligand.

5. The organic electroluminescent device according to claim 2,
    wherein the phosphorescent material is an iridium complex having a fluorine-substituted phenyl group in a ligand.

6. The organic electroluminescent device according to claim 1,
    wherein the light-emitting layer comprises the at least one compound represented by formula (1).

7. The organic electroluminescent device according to claim 1,
    wherein the at least one compound represented by formula (1) is represented by formula (2):

Formula (2):

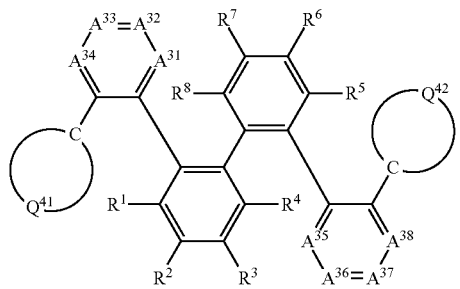

wherein $Q^{41}$ and $Q^{42}$ each independently represents an atomic group for forming an aromatic hydrocarbon ring or an aromatic heterocyclic ring in combination with the carbon atom in formula (4), provided that $Q^{41}$ and $Q^{42}$ are not combined through a single bond, a divalent aromatic hydrocarbon ring group or a divalent aromatic heterocyclic ring group;
    $A^{31}$ to $A^{38}$ each independently represents N or C—$R^{31}$ to C—$R^{38}$;
    $R^{31}$ to $R^{38}$ each independently represents a hydrogen atom or a substituent; and
    $R^1$ to $R^8$ each independently represents a hydrogen atom or a substituent.

8. The organic electroluminescent device according to claim 1,
    wherein the at least one compound represented by formula (1) is represented by formula (3):

Formula (3):

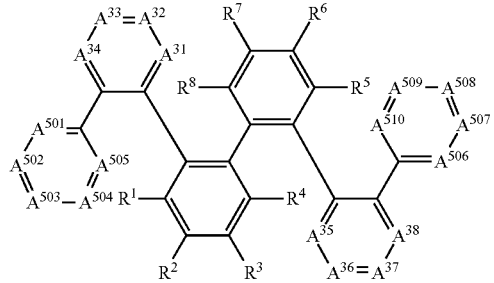

wherein $A^{31}$ to $A^{38}$ and $A^{501}$ to $A^{510}$) each independently represents N or C—$R^{31}$ to C—$R^{38}$ and C—$R^{501}$ to C—$R^{510}$;

$R^{31}$ to $R^{38}$ and $R^{501}$ to $R^{510}$ each independently represents a hydrogen atom or a substituent; and $R^1$ to $R^8$ each independently represents a hydrogen atom or a substituent.

* * * * *